(12) United States Patent
Tavallaee et al.

(10) Patent No.: US 11,381,056 B2
(45) Date of Patent: Jul. 5, 2022

(54) LASER CAVITY CONSTRUCTION FOR REDUCED WAVELENGTHS

(71) Applicant: SiLC Technologies, Inc., Monrovia, CA (US)

(72) Inventors: Amir Ali Tavallaee, San Francisco, CA (US); Bradley Jonathan Luff, La Canada Flintridge, CA (US); Mehdi Asghari, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 394 days.

(21) Appl. No.: 16/805,675

(22) Filed: Feb. 28, 2020

(65) Prior Publication Data

US 2021/0273396 A1    Sep. 2, 2021

(51) Int. Cl.
  *H01S 5/00*        (2006.01)
  *H01S 5/02326*     (2021.01)
  *H01S 5/14*        (2006.01)
  *H01S 3/063*       (2006.01)
  *G01S 7/484*       (2006.01)
  *H01S 3/08*        (2006.01)

(52) U.S. Cl.
  CPC ......... *H01S 5/02326* (2021.01); *H01S 5/141* (2013.01); *G01S 7/484* (2013.01); *H01S 3/063* (2013.01); *H01S 3/08009* (2013.01)

(58) Field of Classification Search
  CPC ...... H01S 5/141; H01S 5/02326; H01S 3/063; H01S 3/08009
  See application file for complete search history.

(56) References Cited

U.S. PATENT DOCUMENTS

| | | | | |
|---|---|---|---|---|
| 4,786,132 A | * | 11/1988 | Gordon ............... | G02B 6/4202 385/38 |
| 4,914,665 A | * | 4/1990 | Sorin .................. | H01S 3/1055 372/20 |
| 4,955,028 A | * | 9/1990 | Alferness ............ | H01S 3/1055 372/99 |

(Continued)

OTHER PUBLICATIONS

Copenheaver, Blaine R., International Search Report and Written Opinion, PCT/US2021/018929, International Searching Authority, U.S. Patent and Trademark Office, dated Apr. 29, 2021.

*Primary Examiner* — Kinam Park
(74) *Attorney, Agent, or Firm* — Gavrilovich, Dodd & Lindsey LLP

(57) ABSTRACT

A light source has a resonant laser cavity with an optical grating and a waveguide that has a longitudinal axis. A portion of the longitudinal axis extends through the optical grating and serves as a grating axis. The laser cavity is configured to generate a laser signal that exits the laser cavity through the optical grating. The optical grating includes multiple perturbation structures that each causes a perturbation in an effective refractive index of the waveguide. The perturbation structures are staggered on the waveguide such that the perturbation structures that are adjacent to one another in a longitudinal direction are spaced apart in a transverse direction. The longitudinal direction is a direction parallel to the grating axis and the transverse direction is a direction transverse to the longitudinal direction.

20 Claims, 9 Drawing Sheets

(56) References Cited

U.S. PATENT DOCUMENTS

| | | | |
|---|---|---|---|
| 6,035,083 A * | 3/2000 | Brennan, III | G02B 6/29394 |
| | | | 359/569 |
| 6,480,513 B1 | 11/2002 | Kapany et al. | |
| 6,970,621 B1 * | 11/2005 | Fried | G02B 6/126 |
| | | | 385/11 |
| 2003/0231686 A1 | 12/2003 | Liu | |
| 2005/0237617 A1 * | 10/2005 | Carr | G02B 26/0808 |
| | | | 359/569 |
| 2007/0223856 A1 * | 9/2007 | Nunoya | H01S 5/06206 |
| | | | 385/14 |
| 2008/0205461 A1 | 8/2008 | Henrichs | |
| 2014/0054451 A1 * | 2/2014 | Abedin | G01D 5/3537 |
| | | | 385/13 |
| 2014/0112357 A1 | 4/2014 | Abedin et al. | |
| 2016/0261091 A1 | 9/2016 | Santis et al. | |
| 2016/0373191 A1 | 12/2016 | Fathololoumi et al. | |
| 2018/0306925 A1 | 10/2018 | Hosseini et al. | |
| 2022/0075121 A1 * | 3/2022 | Lowder | H01S 3/06733 |
| 2022/0085567 A1 * | 3/2022 | Lowder | H01S 3/302 |

\* cited by examiner

LASER CAVITY CONSTRUCTION FOR REDUCED WAVELENGTHS

FIELD

The invention relates to optical devices. In particular, the invention relates to laser systems.

BACKGROUND

There is an increasing commercial demand for 3D sensing systems that can be economically deployed in applications such as ADAS (Advanced Driver Assistance Systems) and AR (Augmented Reality). LIDAR (Light Detection and Ranging) sensors are used to construct a 3D image of a target scene by illuminating the scene with laser light and measuring the returned signal.

Lasers used in communications applications often have a wavelength on the order of 1550 nm. Semiconductor lasers with wavelengths on this order often include optical gratings that can be fabricated using a stepper in combination with photolithography. However, shorter wavelengths can enhance system performance in other applications such as LIDAR. As the wavelength decreases, many of the features of semiconductor lasers become smaller. For instance, the pitch of the optical grating generally decreases as the wavelength decreases. This reduction in the dimensions of the laser features often requires a higher degree of photolithography resolution than can be achieved using a stepper. As a result, more expensive technologies often must be used to fabricate the shorter wavelength laser that are desired for use in applications such as LIDAR. The cost associated with fabricating smaller wavelength semiconductor lasers interferes with the commercial adoption of these technologies. Accordingly, there is a need for reduced wavelength semiconductor lasers with reduced fabrication costs.

SUMMARY

A light source has a resonant laser cavity with an optical grating and a waveguide that has a longitudinal axis. A portion of the longitudinal axis extends through the optical grating and serves as a grating axis. The laser cavity is configured to generate a laser signal that exits the laser cavity through the optical grating. The optical grating includes multiple perturbation structures that each causes a perturbation in an effective refractive index of the waveguide. The perturbation structures are staggered on the waveguide such that the perturbation structures that are adjacent to one another in a longitudinal direction are spaced apart in a transverse direction. The longitudinal direction is a direction parallel to the grating axis and the transverse direction is a direction transverse to the longitudinal direction. In some instances, the light source is included in a LIDAR system.

A light source has a resonant laser cavity that includes a waveguide and an optical grating. The laser cavity is configured to generate a laser signal that exits the laser cavity through the optical grating. The optical grating includes multiple perturbation structures that each causes a perturbation in an effective refractive index of the waveguide. The perturbation structures are arranged in sub-gratings such that each sub-grating includes more than one of the perturbation structures. The perturbation structures in the same subgroup have the same orientation relative to a longitudinal axis of the waveguide but the perturbation structures in different subgroup have different orientations relative to the longitudinal axis of the waveguide.

BRIEF DESCRIPTION OF THE FIGURES

FIG. 9A is a topview of the light source.

FIG. 9B is a cross section of the light source shown in FIG. 9A taken along the line labeled B.

FIG. 9C is a cross section of the light source taken along a line extending between the brackets labeled C in FIG. 9A.

FIG. 9D is a cross section of the light source taken along a line extending between the brackets labeled D in FIG. 9A.

FIG. 9E is a cross section of the light source of FIG. 9A taken along a line extending between the brackets labeled E in FIG. 9A.

FIG. 9F is a topview of a portion of the light source shown in FIG. 9A. The topview of FIG. 9F magnifies the portion of FIG. 9A that includes the optical grating.

FIG. 9G is a perspective view of a portion of the utility waveguide and optical grating shown in FIG. 9F.

FIG. 9H is an example of a cross section of the utility waveguide and optical grating shown in FIG. 9G taken along the line labeled H in FIG. 9G.

DESCRIPTION

A LIDAR system includes a light source having a laser cavity laser that includes an optical grating. The laser cavity outputs a laser signal that exits from the laser cavity through the optical grating. The optical grating includes perturbation regions that each creates a perturbation in the effective refractive index of a waveguide. The perturbation regions are staggered on the waveguide such that perturbation regions that are adjacent to one another on the waveguide are spaced apart in the transverse direction of the waveguide. Perturbation regions in conventional reflective gratings are not spaced apart in the transverse direction but instead overlap one another in the transverse direction.

Separating the perturbation regions in the transverse direction increases the shortest distance between perturbation regions that are adjacent to one another on the waveguide. Increasing the shortest distance between adjacent perturbation regions lowers the level of resolution required to fabricate the perturbation regions. Reducing the required level of resolution allows the optical grating to be fabricated by conventional fabrication processes such as photolithography and etching. Conventional fabrication processes have reduced costs compared to higher resolution processes. As a result, the ability to fabricate the optical grating with conventional fabrication technologies reduces the cost associated with fabricating the optical grating.

Figure 1:
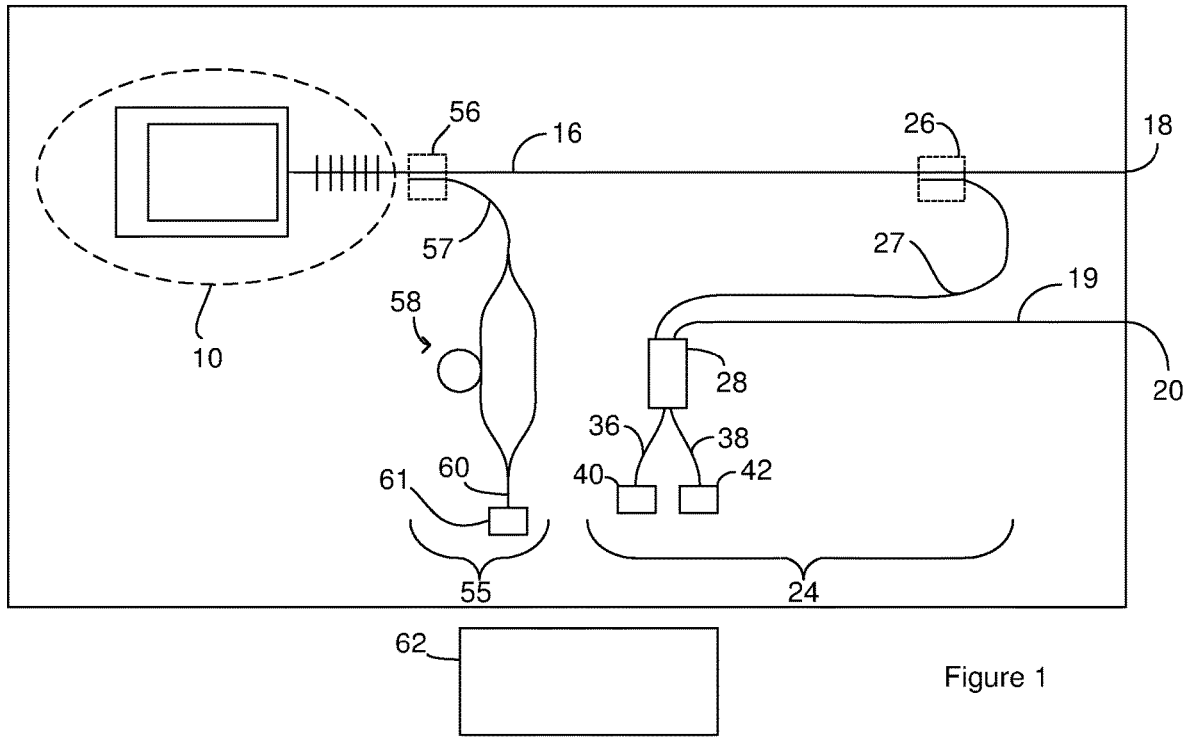
FIG. 1 is a top view of a LIDAR chip.

FIG. 1 is a topview of an example of a LIDAR chip. The LIDAR chip can include a Photonic Integrated Circuit (PIC) and can be a Photonic Integrated Circuit (PIC) chip. The LIDAR chip includes a light source 10. The output of the light source 10 is received by a utility waveguide 16 and serves as an outgoing LIDAR signal on the utility waveguide 16. The utility waveguide 16 terminates at a facet 18 and carries the outgoing LIDAR signal to the facet 18. The facet 18 can be positioned such that the outgoing LIDAR signal traveling through the facet 18 exits the chip and serves as a LIDAR output signal. For instance, the facet 18 can be positioned at an edge of the chip so the outgoing LIDAR signal traveling through the facet 18 exits the chip and serves as a LIDAR output signal.

The LIDAR output signal travels away from the chip and may be reflected by objects in the path of the LIDAR output signal. When the LIDAR output signal is reflected, at least a portion of the light from the reflected signal is returned to an input waveguide 19 on the LIDAR chip as a first LIDAR input signal. The input waveguide 19 includes a facet 20 through which the first LIDAR input signal can enter the input waveguide 19. The portion of the first LIDAR input signal that enters the input waveguide 19 can be considered an incoming LIDAR signal and acts as a comparative signal carried by the input waveguide 19. The input waveguide 19 carries the comparative signal to a light-combining component 28.

The chip includes a data branch 24 where the optical signals that are processed for LIDAR data are generated. The data branch includes a splitter 26 that moves a portion of the outgoing LIDAR signal from the utility waveguide 16 into the data branch. For instance, the splitter 26 moves a portion of the outgoing LIDAR signal from the utility waveguide 16 onto a reference waveguide 27 as a reference signal. The reference waveguide 27 carries the reference signal to the light-combining component 28. The illustrated splitter 26 is an optical coupler that operates as a result of positioning the utility waveguide 16 sufficiently close to the reference waveguide 27 that light from the utility waveguide 16 is coupled into the reference waveguide 27; however, other signal tapping components can be used to move a portion of the of the light signals from the utility waveguide 16 onto the reference waveguide 27. Examples of suitable splitters 26 include, but are not limited to, y-junctions, optical couplers, and multi-mode interference couplers (MMIs).

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and the first LIDAR input signal. In contrast, the comparative signal includes light from the first LIDAR input signal. For instance, the comparative signal can serve as a sample of the first LIDAR input signal. Accordingly, the comparative signal includes or consists of light that has been reflected by an object located off the chip in a sample region in a field of view while the reference signal does not include light that has been reflected by the object. When the chip and the reflecting object are moving relative to one another, the comparative signal and the reference signal may have different frequencies at least partially due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light combining component 28, the first light sensor 40 and the second light sensor 42 can be connected as a balanced photodetector that outputs an electrical data signal. For instance, the light combining component 28, the first light sensor 40 and the second light sensor 42 can be connected such that the DC component of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MMI) device such as a 2×2 MMI device. Other suitable light-combining components 28 include, but are not limited to, adiabatic splitters, and directional coupler. The functions of the illustrated light-combining component 28 can be performed by more than one optical component.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zhender interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency of the outgoing LIDAR signal. For instance, a Mach-Zhender interferometer will output a sinusoidal control light signal with a fringe pattern. Changes to the frequency of the outgoing LIDAR signal will cause changes to the frequency of the control light signal. Accordingly, the frequency of the electrical control signal output from the control light sensor 61 is a function of the frequency of the outgoing LIDAR signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the first light sensor 40, the second light sensor 42, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operates the light source 10 such that the light source 10 outputs the outgoing LIDAR signal. The electronics 62 then operate the LIDAR chip through a series of cycles where LIDAR data is generated for each (radial distance and/or radial velocity between the LIDAR system and a reflecting object) cycle. In some instances, the LIDAR system includes one or more mechanisms for steering the direction that the LIDAR output signal travels away from the LIDAR system. The electronics can operate the one or more mechanisms so as to direct the LIDAR output signal to different sample regions in a field of view. The sample regions can each be associated with one of the cycles and/or each cycle can be associated with one of the sample regions. As a result, each LIDAR data result can be associated with one of the sample regions in the field of view. Different sample regions can overlap one another and/or be separated from one another.

Each cycle includes one or more data periods. During each data period, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes a first data period and a second data period. During the first data period, the electronics 62 can increase the frequency of the LIDAR output signal and during a second sample the electronics 62 can decrease the frequency of the LIDAR output signal. In some instances, the increase and/or decrease in frequency of the LIDAR output signal is linear. In one example, the laser cavity is operated so as to output an outgoing LIDAR signal (and accordingly a LIDAR output signal) with a wavelength of 1310 nm. During the first data period, the electronics 62 can linearly increase the frequency of the outgoing LIDAR signal (and accordingly a LIDAR output signal) such that the wavelength decreases from 1300 nm to 1299.98 nm followed by a second data period where the frequency of the outgoing LIDAR signal is linearly increased from 1299.98 nm to 1300 nm.

When the outgoing LIDAR signal frequency is increased during the first data period, the LIDAR output signal travels away from the LIDAR chip and an object positioned in a sample region of a field of view can reflect light from the LIDAR output signal. At least a portion of the reflected light is then returned to the chip in a first LIDAR input signal. As noted above, a portion of the first LIDAR input signal becomes the comparative signal. During the time that the LIDAR output signal and the first LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the first LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second data period, the comparative signal enters the light-combining component with a higher frequency than the reference signal concurrently entering the light-combining component and the difference between the frequency of the comparative signal and the frequency of the reference signal during the second data period is also function of the distance between the LIDAR system and the reflecting object.

In some instances, the difference between the frequency of the comparative signal and the frequency of the reference signal can also be a function of the Doppler effect because relative movement of the LIDAR system and reflecting object can also affect the frequency of the comparative signal. For instance, when the LIDAR system is moving toward or away from the reflecting object and/or the reflecting object is moving toward or away from the LIDAR system, the Doppler effect can affect the frequency of the comparative signal. Since the frequency of the comparative signal is a function of the radial velocity between the reflecting object and the LIDAR system, the difference between the frequency of the comparative signal and the frequency of the reference signal is also a function of the radial velocity between the reflecting object and the LIDAR system. Accordingly, the difference between the frequency of the comparative signal and the frequency of the reference signal is a function of the distance and/or radial velocity between the LIDAR system and the reflecting object.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance and/or radial velocity between the LIDAR system and the reflecting object.

The beat frequencies ($f_{LDP}$) from two or more different data periods can be combined to generate LIDAR data (distance and/or radial velocity between the reflecting object and the LIDAR chip or LIDAR system). For instance, the beat frequency that the electronics determine from a first data period ($DP_1$) can be combined with the beat frequency that the electronics determine from a second data period ($DP_2$) to determine the LIDAR data. As an example, the following equation can apply during a first data period where the electronics linearly increase the frequency of the outgoing LIDAR signal: $f_{ub} = -f_d + \alpha \tau$ where $f_{ub}$ is the beat frequency, $f_d$ represents the Doppler shift ($f_d = 2vf_c/c$) where $f_c$ represents the optical frequency ($f_o$), c represents the speed of light, v is the radial velocity between the reflecting object and the LIDAR system where the direction from the reflecting object toward the chip is assumed to be the positive direction, and c is the speed of light. The following equation can apply during a second data period where electronics linearly decrease the frequency of the outgoing LIDAR signal: $f_{db} = -f_d \alpha \tau$ where $f_{db}$ is the beat frequency. In these two equations, $f_d$ and $\pi$ are unknowns. The electronics solve these two equations for the two unknowns. The radial velocity for the sample region then be determined from the Doppler shift ($v = c^*f_d/(2f_c)$) and/or the separation distance for that sample region can be determined from $c^*f_d/2$.

In instances where the radial velocity between the LIDAR chip and the reflecting object is zero or very small, the contribution of the Doppler effect to the beat frequency is essentially zero. In these instances, the Doppler effect does not make a substantial contribution to the beat frequency and the electronics 62 can use only the first data period to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during a data period, the electronics 62 can have a range of suitable values for the electrical control signal magnitude as a function of time. At multiple different times during a data period, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

Figure 2:
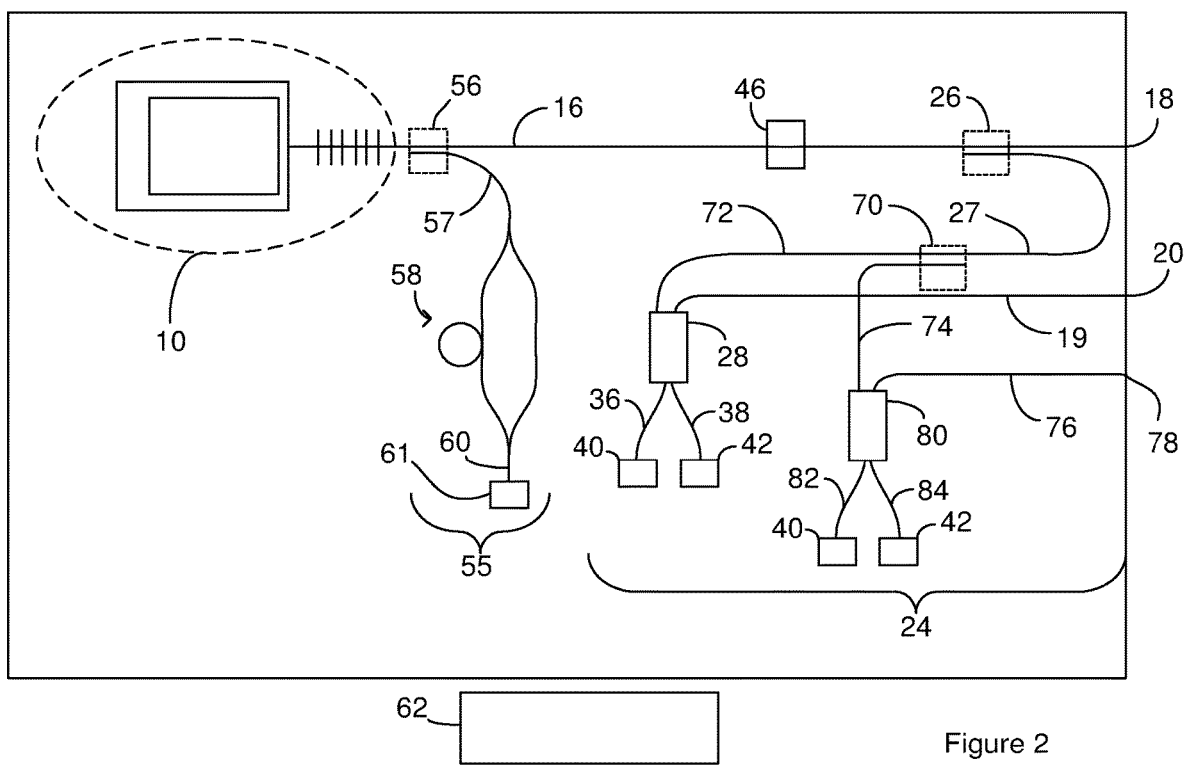
FIG. 2 is a top view of another embodiment of a LIDAR chip.

The LIDAR chip of FIG. 1 can be modified to receive multiple first LIDAR input signals. For instance, FIG. 2 illustrates the LIDAR chip of FIG. 1 modified to receive two first LIDAR input signals. A splitter 70 is configured to move a portion of the reference signal carried on the reference waveguide 27 onto a first reference waveguide 72 and another portion of the reference signal onto a second reference waveguide 74. Accordingly, the first reference waveguide 72 carries a first reference signal and the second reference waveguide 74 carries a second reference signal. The first reference signal is carried to the light-combining component 28 and processed by the light-combining component 28 as described in the context of FIG. 1. Examples of suitable splitters 70 include, but are not limited to, y-junctions, optical couplers, and multi-mode interference couplers (MMIs).

As described above, a LIDAR output signal that travels away from the chip may be reflected by one or more objects in the path of the LIDAR output signal. The reflected signal travels away from the objects. When the LIDAR output signal travel is reflected, at least a portion of the reflected signal is returned to a second input waveguide 76 on the LIDAR chip as a second LIDAR input signal. The second input waveguide 76 includes a facet 78 through which the first LIDAR input signal can enter the second input waveguide 76. The portion of the second LIDAR input signal that enters the input waveguide 19 acts as a second comparative signal carried by the second input waveguide 76.

The second input waveguide 76 carries the second comparative signal to a second light-combining component 80. Additionally, the second reference waveguide 74 carries the second reference signal to the second light-combining component 80. The second light-combining component 80 combines the second comparative signal and the second reference signal into a second composite signal. The second reference signal includes light from the outgoing LIDAR signal. For instance, the second reference signal can serve as a sample of the outgoing LIDAR signal. The second reference signal can exclude light from the LIDAR output signal and the second LIDAR input signal. In contrast, the second comparative signal includes light from the second LIDAR input signal. For instance, the second comparative signal can serve as a sample of the second LIDAR input signal. Accordingly, the second comparative signal has been reflected by an object located outside of the LIDAR system while the second reference signal has not been reflected. When the chip and the reflecting object are moving relative to one another, the second comparative signal and the second reference signal may have different frequencies at least partially due to the Doppler effect. As a result, beating occurs between the second comparative signal and the second reference signal.

The second light-combining component 80 also splits the resulting second composite signal onto a first detector waveguide 82 and a second detector waveguide 84. The first detector waveguide 82 carries a first portion of the second composite signal to a first light sensor 40 that converts the first portion of the second composite signal to a first electrical signal. The second detector waveguide 84 carries a second portion of the second composite sample signal to a second light sensor 42 that converts the second portion of the composite sample signal to a second electrical signal. Examples of suitable light sensors include germanium photodiodes (PDs), and avalanche photodiodes (APDs).

The second light combining component 80, the associated first light sensor 40 and the associated second light sensor 42 can be connected as a balanced photodetector that outputs a second electrical data signal. For instance, the second light combining component 80, the associated first light sensor 40 and the associated second light sensor 42 can be connected such that the DC component of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable second light-combining component 80 is a Multi-Mode Interference (MMI) device such as a 2×2 MMI device. Other suitable second light-combining components 80 include, but are not limited to, adiabatic splitters, and directional couplers. The functions of the illustrated second light-combining component 80 can be performed by more than one optical component.

The electronics 62 can operate one or more components on the chip to generate LIDAR outputs signals over multiple different cycles as described above. Additionally, the electronics 62 can process the second electrical signal as described above in the context of FIG. 1. Accordingly, the electronics can generate second LIDAR data results from the second composite signals and/or LIDAR data results from the composite signals. As a result, the second LIDAR data results and/or the LIDAR data results can be generated from the same LIDAR output signal.

Figure 3:
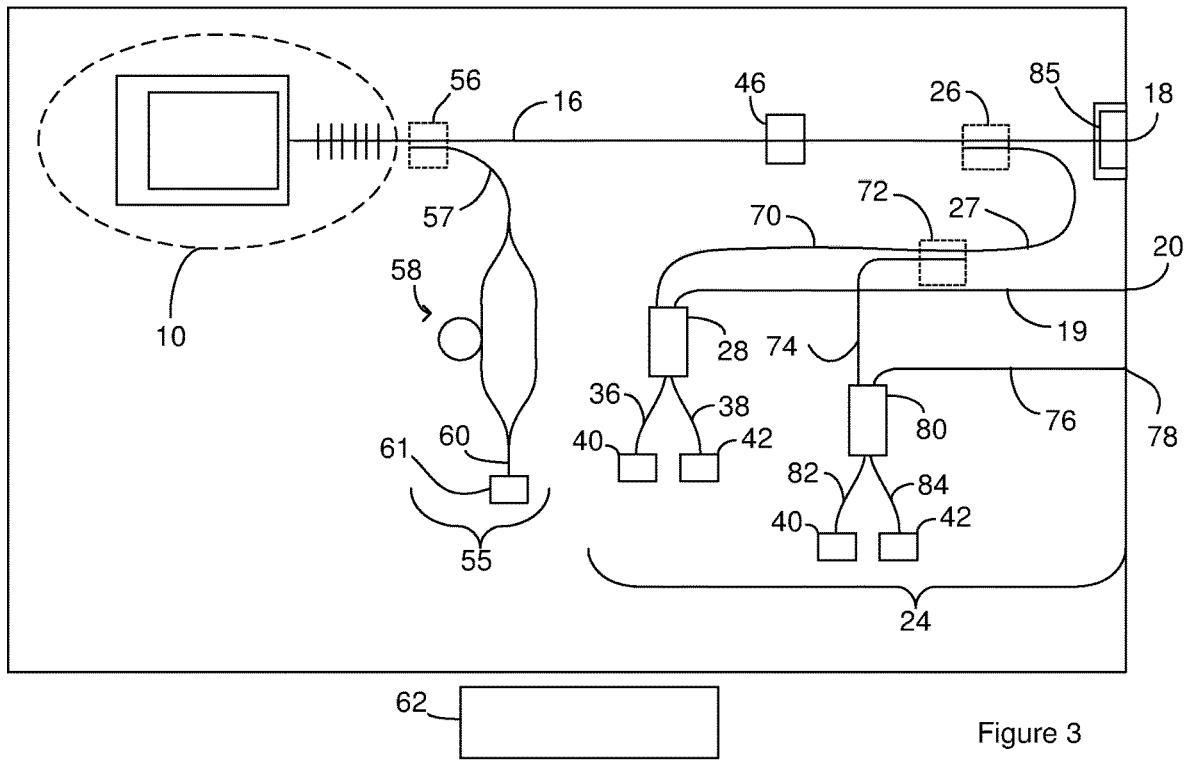
FIG. 3 is a top view of another embodiment of a LIDAR chip.

The LIDAR chips can be modified to include other components. For instance, FIG. 3 illustrates the LIDAR chip of FIG. 2 modified to include an amplifier 85 positioned at an edge of the LIDAR chip such that the utility waveguide 16 terminates at a facet of the amplifier 85. The amplifier 85 can be operated by the electronics 62. As a result, the electronics 62 can control the power of the LIDAR output signal. Suitable amplifiers include, but are not limited to, Erbium-doped fiber amplifiers (EDFAs), Erbium-doped waveguide amplifiers (EDWAs), and Semiconductor Optical Amplifiers (SOAs).

Figure 4:
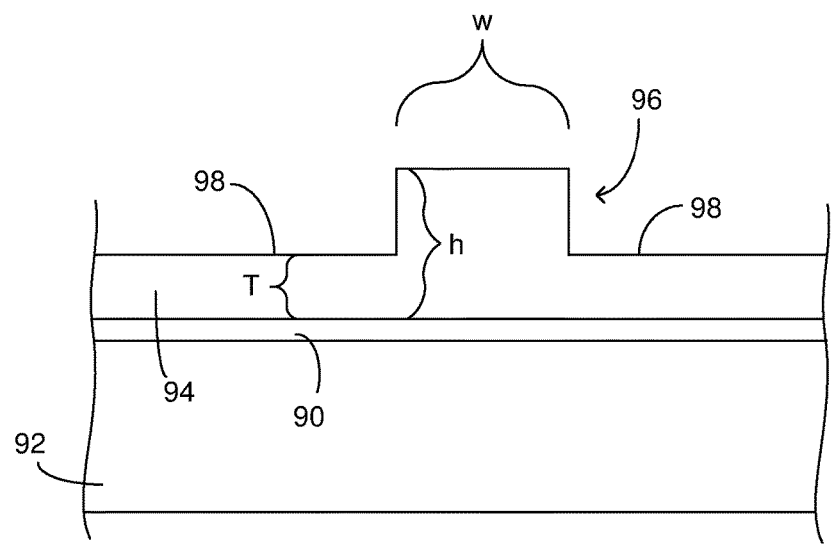
FIG. 4 is a cross-section of a LIDAR chip according to FIG. 1 through 3 constructed from a silicon-on-insulator wafer.

Suitable platforms for the LIDAR chips include, but are not limited to, silica, indium phosphide, and silicon-on-insulator wafers. FIG. 4 is a cross-section of portion of a chip constructed from a silicon-on-insulator wafer. A silicon-on-insulator (SOI) wafer includes a buried layer 90 between a substrate 92 and a light-transmitting medium 94. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 through FIG. 3 can be positioned on or over the top and/or lateral sides of the substrate.

The portion of the chip illustrated in FIG. 4 includes a waveguide construction that is suitable for use with chips constructed from silicon-on-insulator wafers. A ridge 96 of the light-transmitting medium extends away from slab regions 98 of the light-transmitting medium. The light signals are constrained between the top of the ridge and the buried oxide layer.

The dimensions of the ridge waveguide are labeled in FIG. 4. For instance, the ridge has a width labeled w and a height labeled h. A thickness of the slab regions is labeled T. For LIDAR applications, these dimensions can be more important than other dimensions because of the need to use higher levels of optical power than are used in other applications. The ridge width (labeled w) is greater than 1 µm and less than 4 µm, the ridge height (labeled h) is greater than 1 µm and less than 4 µm, the slab region thickness is greater than 0.5 µm and less than 3 µm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 µm and less than 0.5 µm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 4 is suitable for all or a portion of the waveguides on LIDAR chips constructed according to FIG. 1 through FIG. 3.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu City, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 18 located at an edge of the chip and the light sensor can be attached to the edge of the chip over the facet 18 such that the light sensor receives light that passes through the facet 18. The use of light sensors that are a separate component from the chip is suitable for all or a portion of the light sensors selected from the group consisting of the first light sensor 40, the second light sensor 42, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10, 2012; U.S. Pat. No. 8,242,432, issued Aug. 14, 2012; and U.S. Pat. No. 6,108,8472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 54, and the control light sensor 61.

Amplifiers that are interfaced with waveguides on a chip can be a component that is separate from the chip and then attached to the chip. For instance, the amplifier can be a Semiconductor Optical Amplifier (SOA) or Booster Optical Amplifier (BOA) as a discrete component. Examples of discrete component amplifiers include, but are not limited to, BOA1007C manufactured by Thorlabs located in Newton, N.J., USA. These amplifiers can be centrally located on the LIDAR chip. Alternately, all or a portion the waveguides that terminate at an amplifier 18 located at an edge of the LIDAR chip such that the amplifier receives light that passes through the amplifier. As an alternative to an amplifier that is a discrete component, all or a portion of the amplifiers can be integrated with the LIDAR chip. For instance, examples of amplifiers that are interfaced with ridge waveguides on a chip constructed from a silicon-on-insulator wafer can be found in U.S. Patent Application Ser. No. 62/814,844, U.S. Pat. Nos. 9,025,241, and 7,542,641 each of which is incorporated herein in its entirety.

Construction of optical gratings that are integrated with a variety of optical device platforms are available. For instance, a Bragg grating can be formed in a ridge waveguides by forming grooves in the top of the ridge and/or in the later sides of the ridge.

Suitable electronics can include, but are not limited to, a controller that includes or consists of analog electrical circuits, digital electrical circuits, processors, microprocessors, digital signal processors (DSPs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

The LIDAR chips can be used in conjunction with a LIDAR adapter. In some instances, the LIDAR adapter can be physically optically positioned between the LIDAR chip and the one or more reflecting objects and/or the field of view in that an optical path that the first LIDAR input signal(s) and/or the LIDAR output signal travels from the LIDAR chip to the field of view passes through the LIDAR adapter. Additionally, the LIDAR adapter can be configured to operate on the first LIDAR input signal and the LIDAR output signal such that the first LIDAR input signal and the LIDAR output signal travel on different optical pathways between the LIDAR adapter and the LIDAR chip but on the same optical pathway between the LIDAR adapter and a reflecting object in the field of view.

Figure 5:
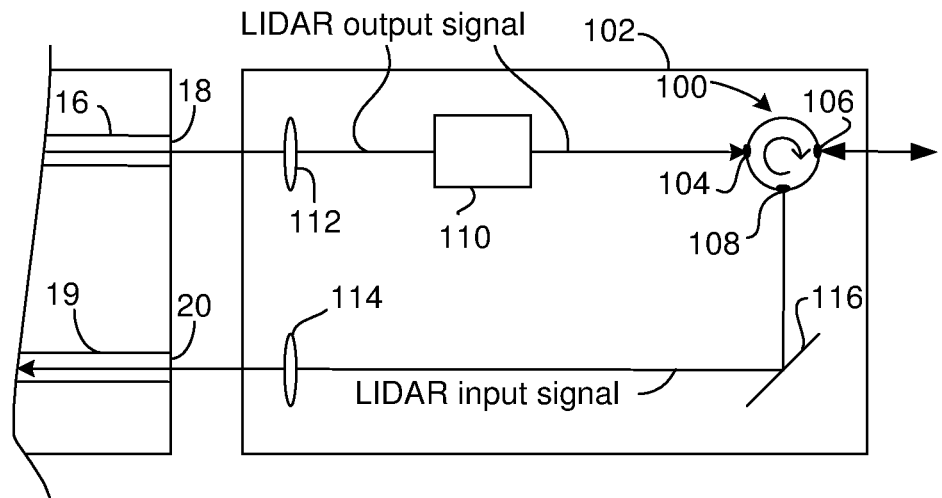
FIG. 5 is a top view of a LIDAR adapter.

An example of a LIDAR adapter that is suitable for use with the LIDAR chip of FIG. 1 is illustrated in FIG. 5. The LIDAR adapter includes multiple components positioned on a base. For instance, the LIDAR adapter includes a circulator 100 positioned on a base 102. The illustrated optical circulator 100 includes three ports and is configured such that light entering one port exits from the next port. For instance, the illustrated optical circulator includes a first port 104, a second port 106, and a third port 108. The LIDAR output signal enters the first port 104 from the utility waveguide 16 of the LIDAR chip and exits from the second port 106. The LIDAR adapter can be configured such that the output of the LIDAR output signal from the second port 106 can also serve as the output of the LIDAR output signal from the LIDAR adapter. As a result, the LIDAR output signal can be output from the LIDAR adapter such that the LIDAR output signal is traveling toward a sample region in the field of view.

The LIDAR output signal output from the LIDAR adapter includes, consists of, or consists essentially of light from the LIDAR output signal received from the LIDAR chip. Accordingly, the LIDAR output signal output from the LIDAR adapter may be the same or substantially the same as the LIDAR output signal received from the LIDAR chip. However, there may be differences between the LIDAR output signal output from the LIDAR adapter and the LIDAR output signal received from the LIDAR chip. For instance, the LIDAR output signal can experience optical loss as it travels through the LIDAR adapter.

When an object in the sample region reflects the LIDAR output signal, at least a portion of the reflected light travels back to the circulator 100 as a LIDAR return signal. The LIDAR return signal enters the circulator 100 through the second port 106. FIG. 5 illustrates the LIDAR output signal and the LIDAR return signal traveling between the LIDAR adapter and the sample region along the same optical path.

The LIDAR return signal exits the circulator 100 through the third port 108 and is directed to the input waveguide 19 on the LIDAR chip. Accordingly, light from the LIDAR return signal can serve as the first LIDAR input signal and the first LIDAR input signal includes or consists of light from the LIDAR return signal. Accordingly, the LIDAR output signal and the first LIDAR input signal travel between the LIDAR adapter and the LIDAR chip along different optical paths.

As is evident from FIG. 5, the LIDAR adapter can include optical components in addition to the circulator 100. For instance, the LIDAR adapter can include components for directing and controlling the optical path of the LIDAR output signal and the LIDAR return signal. As an example, the adapter of FIG. 5 includes an optional amplifier 110 positioned so as to receive and amplify the LIDAR output signal before the LIDAR output signal enters the circulator 100. The amplifier 110 can be operated by the electronics 62 allowing the electronics 62 to control the power of the LIDAR output signal.

FIG. 5 also illustrates the LIDAR adapter including an optional first lens 112 and an optional second lens 114. The first lens 112 can be configured to couple the LIDAR output signal to a desired location. In some instances, the first lens 112 is configured to focus or collimate the LIDAR output signal at a desired location. In one example, the first lens 112 is configured to couple the LIDAR output signal on the first port 104 when the LIDAR adapter does not include an amplifier 110. As another example, when the LIDAR adapter includes an amplifier 110, the first lens 112 can be configured to couple the LIDAR output signal on the entry port to the amplifier 110. The second lens 114 can be configured to couple the LIDAR output signal at a desired location. In some instances, the second lens 114 is configured to focus or collimate the LIDAR output signal at a desired location. For instance, the second lens 114 can be configured to couple the LIDAR output signal the on the facet 20 of the input waveguide 19.

The LIDAR adapter can also include one or more direction changing components such as mirrors. FIG. 5 illustrates the LIDAR adapter including a mirror as a direction-changing component 116 that redirects the LIDAR return signal from the circulator 100 to the facet 20 of the input waveguide 19.

The LIDAR chips include one or more waveguides that constrains the optical path of one or more light signals. While the LIDAR adapter can include waveguides, the optical path that the LIDAR return signal and the LIDAR output signal travel between components on the LIDAR adapter and/or between the LIDAR chip and a component on the LIDAR adapter can be free space. For instance, the LIDAR return signal and/or the LIDAR output signal can travel through the atmosphere in which the LIDAR chip, the LIDAR adapter, and/or the base 102 is positioned when traveling between the different components on the LIDAR adapter and/or between a component on the LIDAR adapter and the LIDAR chip. As a result, optical components such as lenses and direction changing components can be employed to control the characteristics of the optical path traveled by the LIDAR return signal and the LIDAR output signal on, to, and from the LIDAR adapter.

Suitable bases 102 for the LIDAR adapter include, but are not limited to, substrates, platforms, and plates. Suitable substrates include, but are not limited to, glass, silicon, and ceramics. The components can be discrete components that are attached to the substrate. Suitable techniques for attaching discrete components to the base 102 include, but are not limited to, epoxy, solder, and mechanical clamping. In one example, one or more of the components are integrated components and the remaining components are discrete components. In another example, the LIDAR adapter includes one or more integrated amplifiers and the remaining components are discrete components.

The LIDAR system can be configured to compensate for polarization. Light from a laser source is typically linearly polarized and hence the LIDAR output signal is also typically linearly polarized. Reflection from an object may change the angle of polarization of the returned light. Accordingly, the LIDAR return signal can include light of different linear polarization states. For instance, a first portion of a LIDAR return signal can include light of a first linear polarization state and a second portion of a LIDAR return signal can include light of a second linear polarization state. The intensity of the resulting composite signals is proportional to the square of the cosine of the angle between the comparative and reference signal polarization fields. If the angle is 90 degrees, the LIDAR data can be lost in the resulting composite signal. However, the LIDAR system can be modified to compensate for changes in polarization state of the LIDAR output signal.

Figure 6:
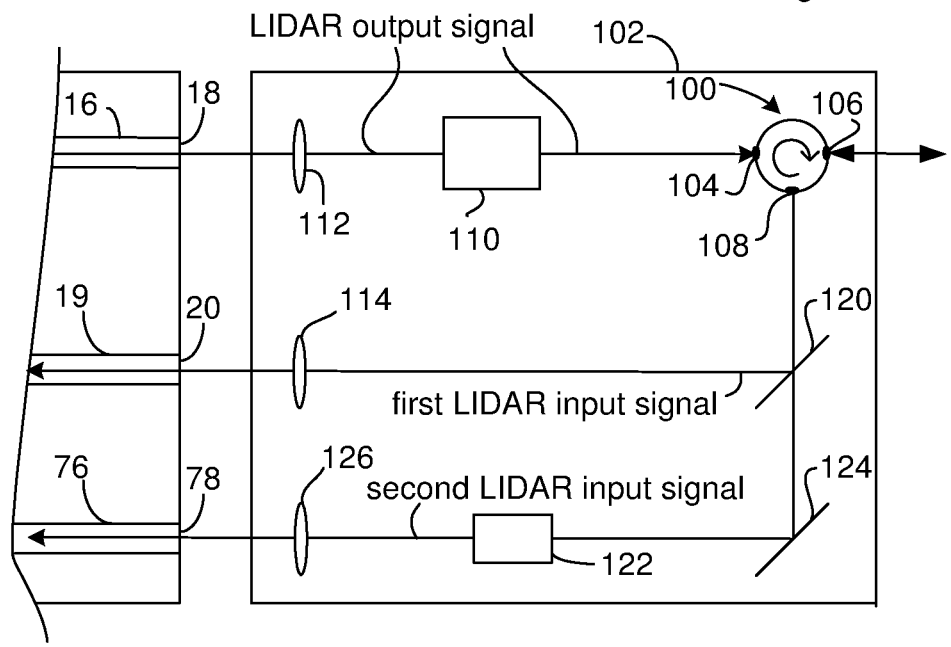
FIG. 6 is a top view of a LIDAR adapter for use with a LIDAR system providing polarization compensation.

FIG. 6 illustrates the LIDAR system of FIG. 5 modified such that the LIDAR adapter is suitable for use with the LIDAR chip of FIG. 2 or FIG. 3. The LIDAR adapter includes a beamsplitter 120 that receives the LIDAR return signal from the circulator 100. The beamsplitter 120 splits the LIDAR return signal into a first portion of the LIDAR return signal and a second portion of the LIDAR return signal. Suitable beamsplitters include, but are not limited to, Wollaston prisms, and MEMs-based beamsplitters.

The first portion of the LIDAR return signal is directed to the input waveguide 19 on the LIDAR chip and serves as the first LIDAR input signal described in the context of FIG. 1 through FIG. 5. The second portion of the LIDAR return signal is directed a polarization rotator 122. The polarization rotator 122 outputs a second LIDAR input signal that is directed to the second input waveguide 76 on the LIDAR chip and serves as the second LIDAR input signal described in the context of FIG. 2 through FIG. 5.

The beamsplitter 120 can be a polarizing beam splitter. One example of a polarizing beamsplitter is constructed such that the first portion of the LIDAR return signal has a first polarization state but does not have or does not substantially have a second polarization state and the second portion of the LIDAR return signal has a second polarization state but does not have or does not substantially have the first polarization state. The first polarization state and the second polarization state can be linear polarization states and the second polarization state is different from the first polarization state. For instance, the first polarization state can be TE and the second polarization state can be TM or the first polarization state can be TM and the second polarization state can be TE. In some instances, the laser source can linearly polarized such that the LIDAR output signal has the first polarization state. Suitable beamsplitters include, but are not limited to, Wollaston prisms, and MEMs-based polarizing beamsplitters.

A polarization rotator can be configured to change the polarization state of the first portion of the LIDAR return signal and/or the second portion of the LIDAR return signal. For instance, the polarization rotator 122 shown in FIG. 6 can be configured to change the polarization state of the second portion of the LIDAR return signal from the second polarization state to the first polarization state. As a result, the second LIDAR input signal has the first polarization state but does not have or does not substantially have the second polarization state. Accordingly, the first LIDAR input signal and the second LIDAR input signal each have the same polarization state (the first polarization state in this discussion). Despite carrying light of the same polarization state, the first LIDAR input signal and the second LIDAR input signal are associated with different polarization states as a result of the use of the polarizing beamsplitter. For instance, the first LIDAR input signal carries the light reflected with the first polarization state and the second LIDAR input signal carries the light reflected with the second polarization state. As a result, the first LIDAR input signal is associated with the first polarization state and the second LIDAR input signal is associated with the second polarization state.

Since the first LIDAR input signal and the second LIDAR carry light of the same polarization state, the comparative signals that result from the first LIDAR input signal have the same polarization angle as the comparative signals that result from the second LIDAR input signal.

Suitable polarization rotators include, but are not limited to, rotation of polarization-maintaining fibers, Faraday rotators, half-wave plates, MEMs-based polarization rotators and integrated optical polarization rotators using asymmetric y-branches, Mach-Zehnder interferometers and multimode interference couplers.

Since the outgoing LIDAR signal is linearly polarized, the first reference signals can have the same linear polarization angle as the second reference signals. Additionally, the components on the LIDAR adapter can be selected such that the first reference signals, the second reference signals, the comparative signals and the second comparative signals each have the same polarization state. In the example disclosed in the context of FIG. 6, the first comparative signals, the second comparative signals, the first reference signals, and the second reference signals can each have light of the first polarization state.

As a result of the above configuration, the composite signals and the second composite signals each results from combining a reference signal and a comparative signal of the same polarization state and will accordingly provide the desired beating between the reference signal and the comparative signal. For instance, the composite signal results from combining a first reference signal and a first comparative signal of the first polarization state and excludes or substantially excludes light of the second polarization state or the composite signal results from combining a first reference signal and a first comparative signal of the second polarization state and excludes or substantially excludes light of the first polarization state. Similarly, the second composite signal includes a second reference signal and a second comparative signal of the same polarization state will accordingly provide the desired beating between the reference signal and the comparative signal. For instance, the second composite signal results from combining a second reference signal and a second comparative signal of the first polarization state and excludes or substantially excludes light of the second polarization state or the second composite signal results from combining a second reference signal and a second comparative signal of the second polarization state and excludes or substantially excludes light of the first polarization state.

The above configuration results in the LIDAR data for a single sample region in the field of view being generated from multiple different composite signals (i.e. first composite signals and the second composite signal) from the sample region. In some instances, determining the LIDAR data for the sample region includes the electronics combining the LIDAR data from different composite signals (i.e. the composite signals and the second composite signal). In some instances, the LIDAR data is combined by combining signals that each carries LIDAR data before the frequency of the beat signal is determined. As a result, the frequency of the beat signal can be determined from a signal that includes the combined LIDAR data. In some instances, combining the LIDAR data can include taking an average, median, or mode of the LIDAR data generated from the different composite signals. For instance, the electronics can average the distance between the LIDAR system and the reflecting object determined from the composite signal with the distance determined from the second composite signal and/or the electronics can average the radial velocity between the LIDAR system and the reflecting object determined from the composite signal with the radial velocity determined from the second composite signal.

In some instances, determining the LIDAR data for a sample region includes the electronics identifying one or more composite signals (i.e. the composite signal and/or the second composite signal) as the source of the LIDAR data that is most represents reality (the representative LIDAR data). The electronics can then use the LIDAR data from the identified composite signal as the representative LIDAR data to be used for additional processing. For instance, the electronics can identify the signal (composite signal or the second composite signal) with the larger amplitude as having the representative LIDAR data and can use the LIDAR data from the identified signal for further processing by the LIDAR system. In some instances, the electronics combine identifying the composite signal with the representative LIDAR data with combining LIDAR data from different LIDAR signals. For instance, the electronics can identify each of the composite signals with an amplitude above an amplitude threshold as having representative LIDAR data and when more than two composite signals are identified as having representative LIDAR data, the electronics can combine the LIDAR data from each of identified composite signals. When one composite signal is identified as having representative LIDAR data, the electronics can use the LIDAR data from that composite signal as the representative LIDAR data. When none of the composite signals is identified as having representative LIDAR data, the electronics can discard the LIDAR data for the sample region associated with those composite signals.

Although FIG. 6 is described in the context of components being arranged such that the first comparative signals, the second comparative signals, the first reference signals, and the second reference signals each have the first polarization state, other configurations of the components in FIG. 6 can arranged such that the composite signals result from combining a reference signal and a comparative signal of the same linear polarization state and the second composite signal results from combining a reference signal and a comparative signal of the same linear polarization state. For instance, the beamsplitter 120 can be constructed such that the second portion of the LIDAR return signal has the first polarization state and the first portion of the LIDAR return signal has the second polarization state, the polarization rotator receives the first portion of the LIDAR return signal, and the outgoing LIDAR signal can have the second polarization state. In this example, the first LIDAR input signal and the second LIDAR input signal each has the second polarization state.

The above system configurations result in the first portion of the LIDAR return signal and the second portion of the LIDAR return signal being directed into different composite signals. As a result, since the first portion of the LIDAR return signal and the second portion of the LIDAR return signal are each associated with a different polarization state but electronics can process each of the composite signals, the LIDAR system compensates for changes in the polarization state of the LIDAR output signal in response to reflection of the LIDAR output signal.

The LIDAR adapter of FIG. 6 can include additional optical components including passive optical components. For instance, the LIDAR adapter can include an optional third lens 126. The third lens 126 can be configured to couple the second LIDAR output signal at a desired location. In some instances, the third lens 126 focuses or collimates the second LIDAR output signal at a desired location. For instance, the third lens 126 can be configured to focus or collimate the second LIDAR output signal on the facet 78 of the second input waveguide 76. The LIDAR adapter also includes one or more direction changing components 124 such as mirrors and prisms. FIG. 6 illustrates the LIDAR adapter including a mirror as a direction changing component 124 that redirects the second portion of the LIDAR return signal from the circulator 100 to the facet 78 of the second input waveguide 76 and/or to the third lens 126.

Figure 7:
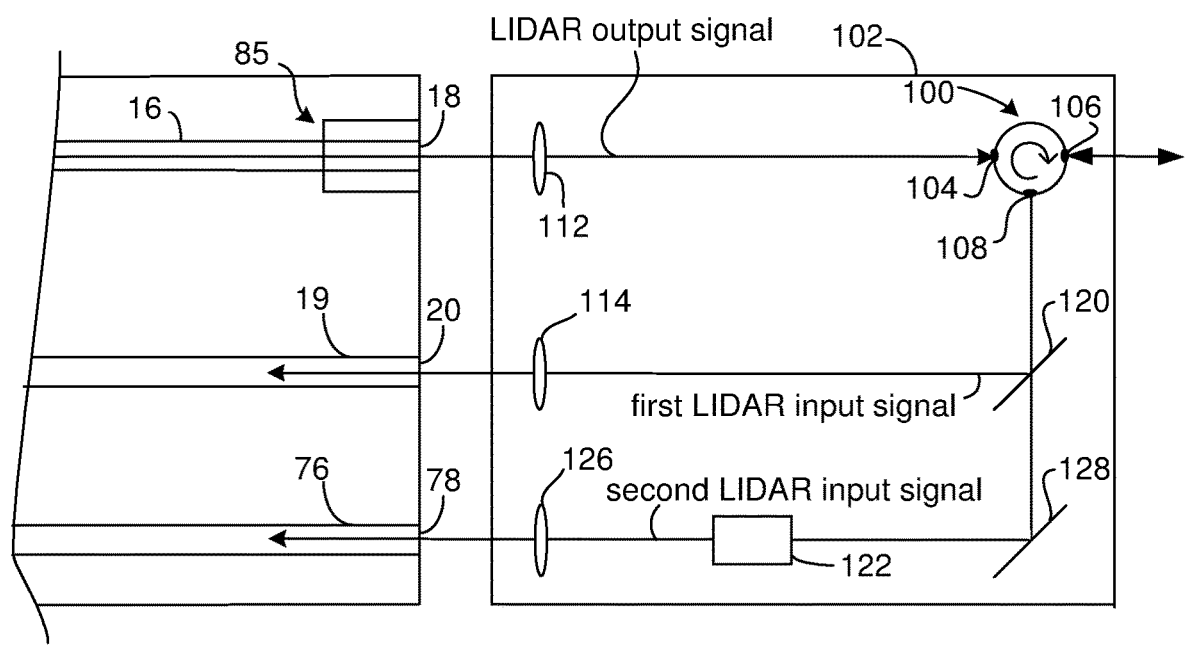
FIG. 7 is a top view of a LIDAR adapter that includes only passive optical components and is suitable for use with a LIDAR system providing polarization compensation.

FIG. 7 illustrates the LIDAR system of FIG. 6 modified such that the LIDAR adapter is suitable for use with the LIDAR chip of FIG. 2 or FIG. 3. The LIDAR output signal is not amplified on the LIDAR adapter of FIG. 7. FIG. 7 illustrates the LIDAR adapter used with the LIDAR chip of FIG. 3. Accordingly, an amplifier 85 operated by the electronics is positioned on the LIDAR chip rather than the LIDAR adapter. In this situation, the active components of the LIDAR system that are operated by the electronics and/or that provide electrical output to the electronics are positioned on the LIDAR chip while the passive components are located on the LIDAR adapter. Accordingly, an example of the LIDAR system has a LIDAR adapter that includes discrete passive components on a base and excludes integrated components on the base while the LIDAR chip includes a combination of discrete and integrated components or includes only integrated optical components.

Figure 8:
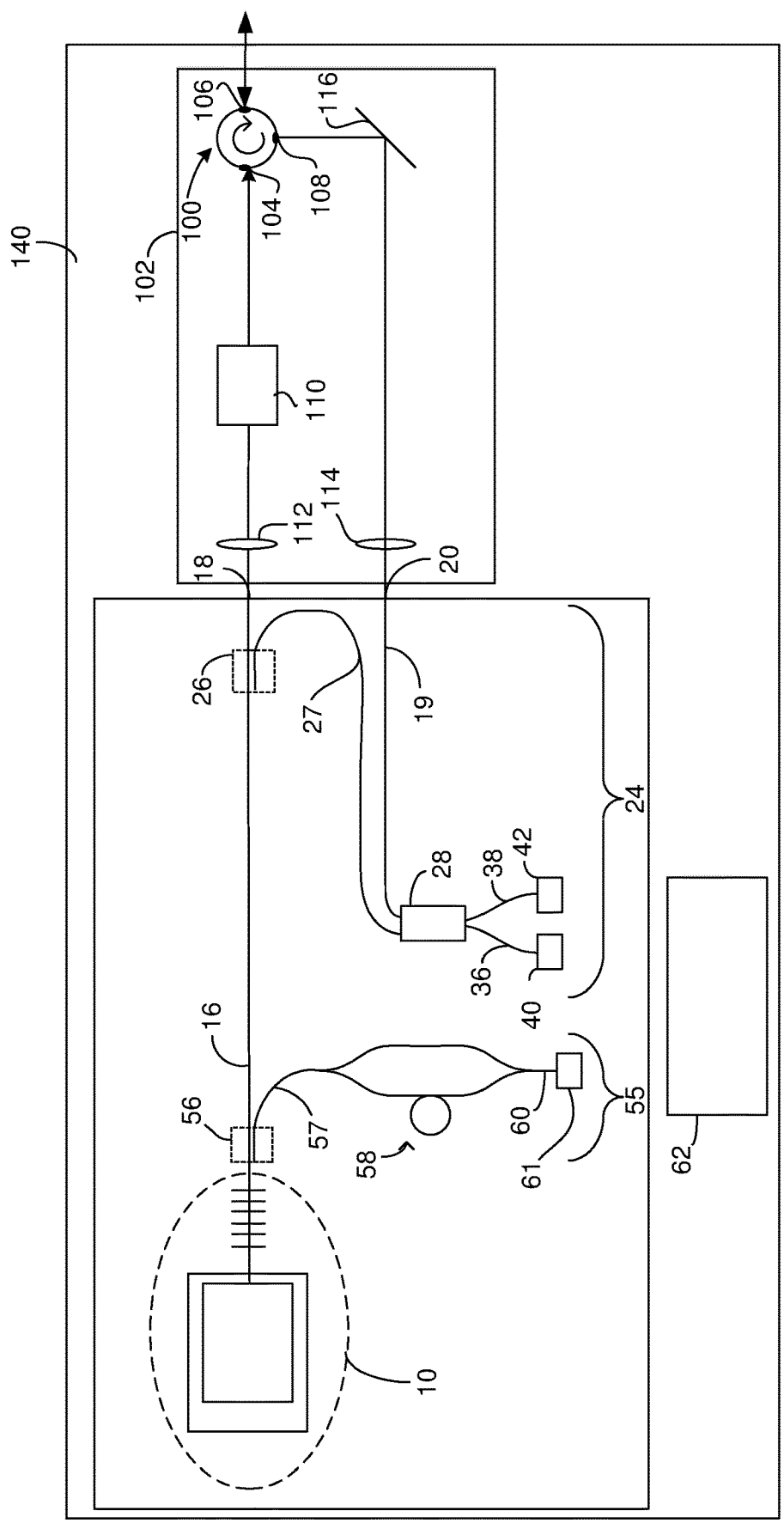
FIG. 8 is a topview of a LIDAR system that includes the LIDAR chip and electronics of FIG. 1 and the LIDAR adapter of FIG. 5 on a common support.

The LIDAR chip, electronics, and the LIDAR adapter can be positioned on a common mount. Suitable common mounts include, but are not limited to, glass plates, metal plates, silicon plates and ceramic plates. As an example, FIG. 8 is a topview of a LIDAR system that includes the LIDAR chip and electronics 62 of FIG. 1 and the LIDAR adapter of FIG. 5 on a common support 140. Although the electronics 62 are illustrated as being located on the common support, all or a portion of the electronics can be located off the common support. Suitable approaches for mounting the LIDAR chip, electronics, and/or the LIDAR adapter on the common support include, but are not limited to, epoxy, solder, and mechanical clamping.

Although the LIDAR system is shown as operating with a LIDAR chip that outputs a single LIDAR output signal, the LIDAR chip can be configured to output multiple LIDAR output signals. Multiple LIDAR adapters can be used with a single LIDAR chip and/or a LIDAR adapter can be scaled to receive multiple LIDAR output signals.

Figure 9A:
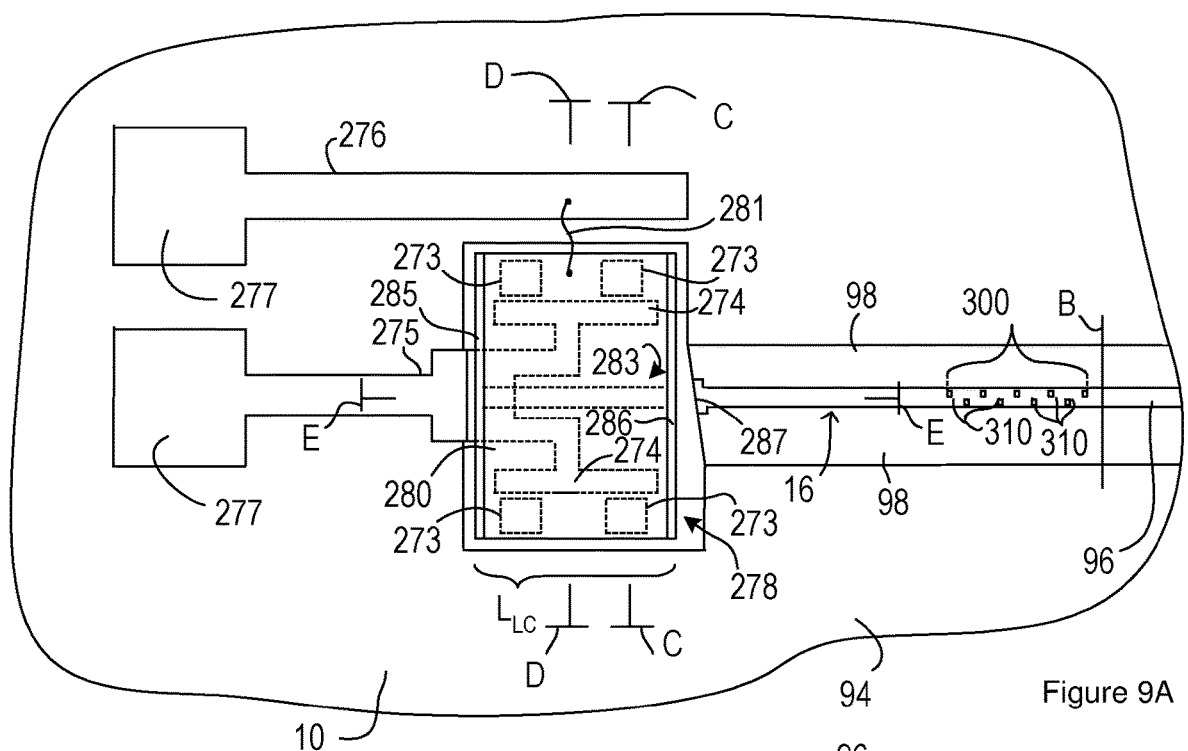
FIG. 9A through FIG. 9H illustrates an example of light source that is suitable for use with the LIDAR system.
Figure 9B:
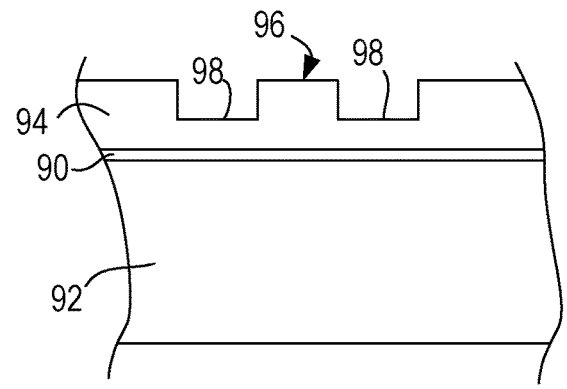
Figure 9C:
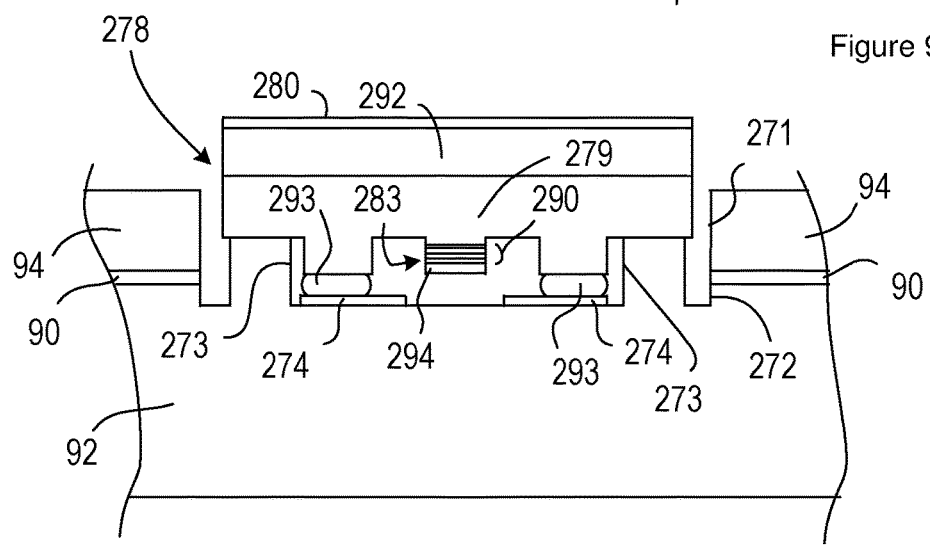
Figure 9D:
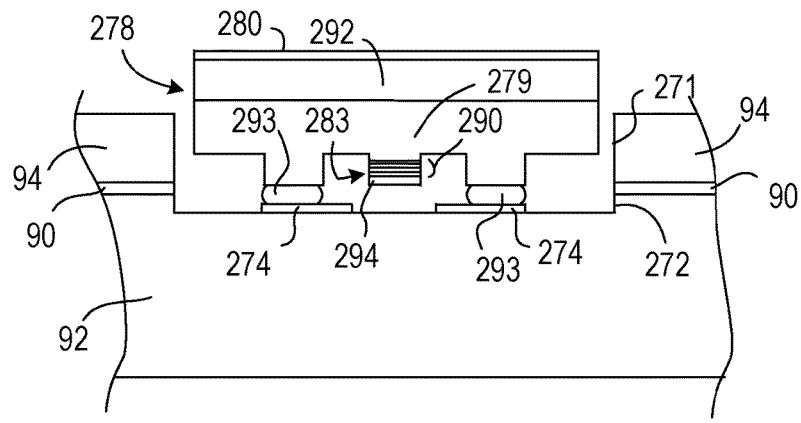
Figure 9E:
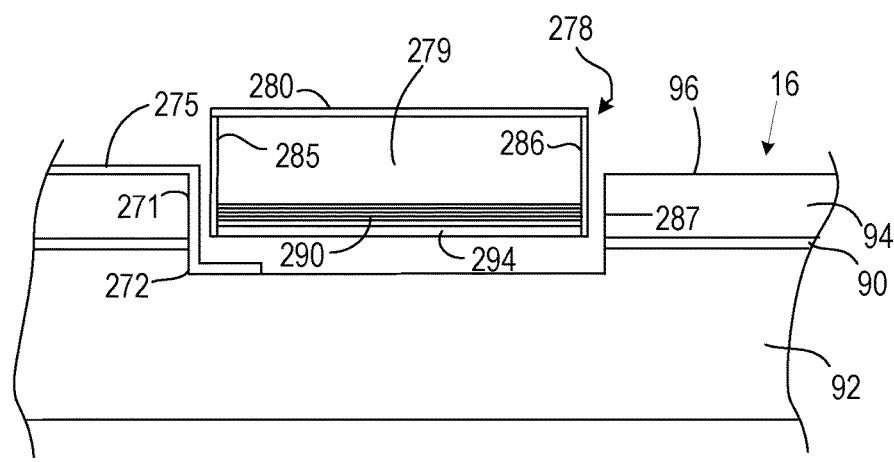
Figure 9F:
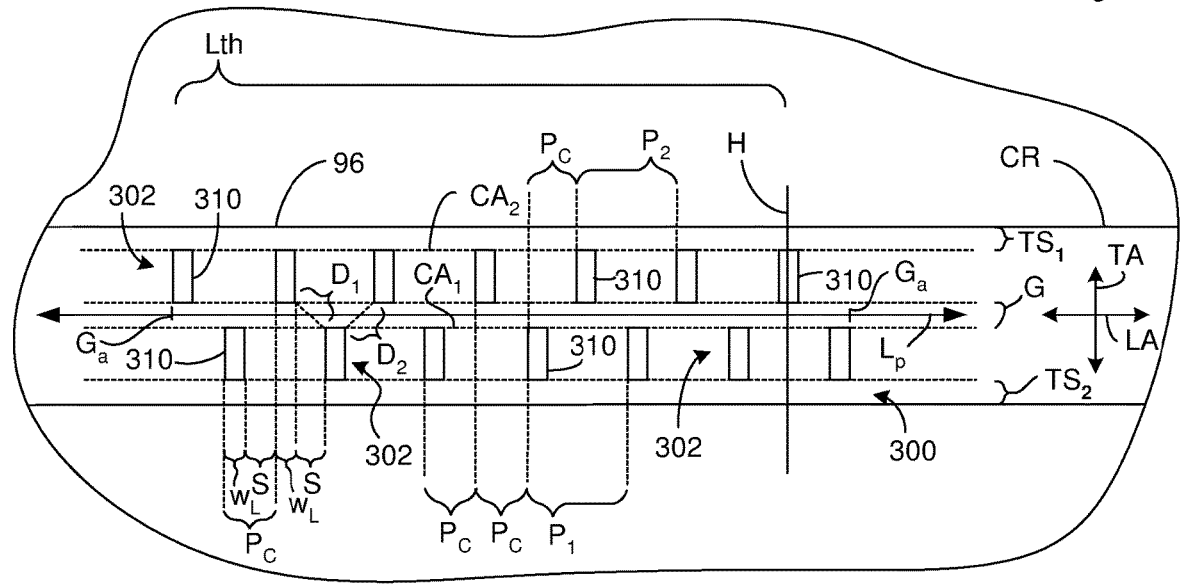
Figure 9G:
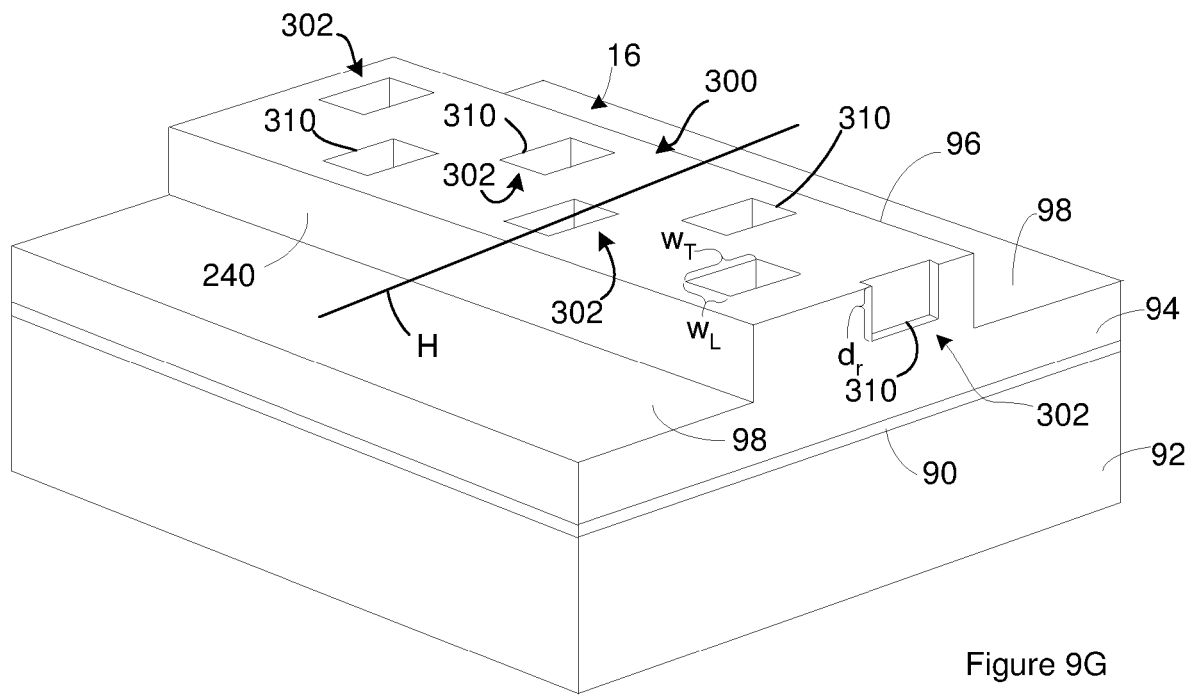
Figure 9H:
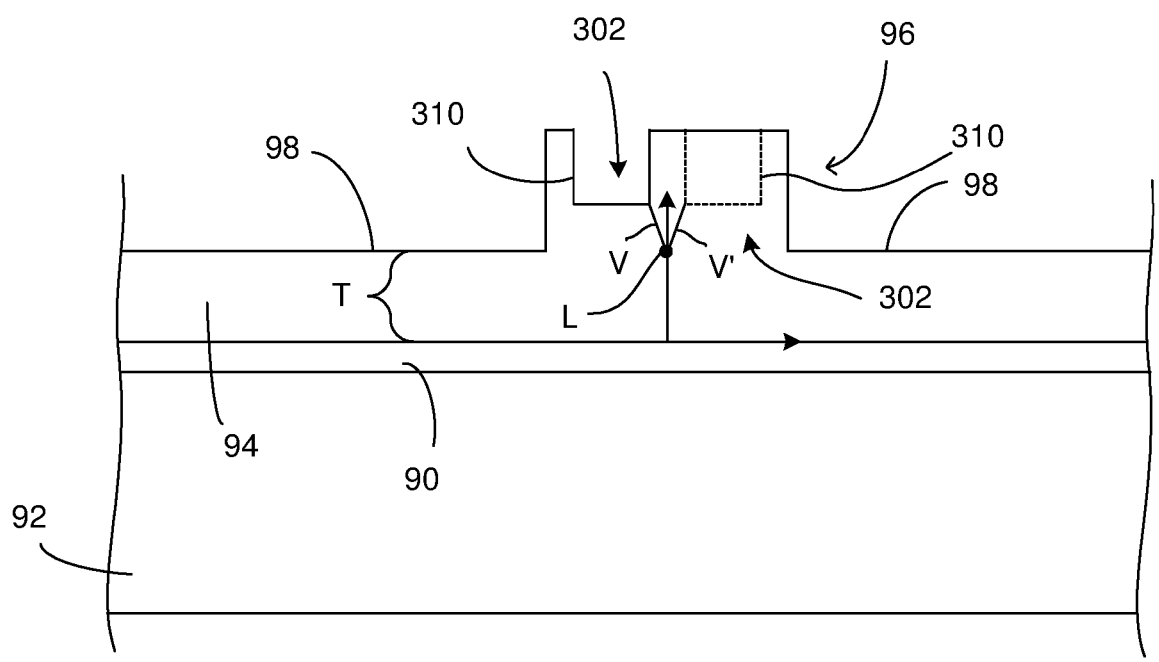

FIG. 9A through FIG. 9H illustrates an example of suitable light source for use with the LIDAR system. FIG. 9A is a topview of the light source. FIG. 9A includes dashed lines that each illustrates a component or a portion of a component that is located beneath other components that are illustrated by solid lines. The relationship between the components shown in FIG. 9A are also evident in FIG. 9B through FIG. 9H. FIG. 9B is a cross section of the light source shown in FIG. 9A taken through the utility waveguide 16 along the line labeled B in FIG. 9A. The utility waveguide 16 illustrated in FIG. 9B is a ridge waveguide that can be constructed as disclosed in the context of FIG. 4. FIG. 9C is a cross section of the light source taken along a line extending between the brackets labeled C in FIG. 9A. FIG. 9C is a cross section of the light source taken along a line extending between the brackets labeled C in FIG. 9A. FIG. 9C is a cross section of the light source taken along a line extending between the brackets labeled C in FIG. 9A. FIG. 9D is a cross section of the light source taken along a line extending between the brackets labeled D in FIG. 9A. FIG. 9E is a cross section of the light source of FIG. 9A taken along a line extending between the brackets labeled E in FIG. 9A. FIG. 9F is a topview of a portion of the light source shown in FIG. 9A. The topview of FIG. 9F shows a closer view of a portion of the utility waveguide 16 shown in of FIG. 9A. The portion of the utility waveguide 16 illustrated in FIG. 9F includes an optical grating that operates as a partial return device. FIG. 9G is a perspective view of a portion of the utility waveguide and optical grating shown in FIG. 9F. FIG. 9H is an example of a cross section of the utility waveguide 16 and optical grating shown in FIG. 9G taken along the line labeled H in FIG. 9G. The light source is illustrated as being on a silicon-on-insulator platform although other platforms are possible.

A first recess 271 extends into or through the light-transmitting medium 94. In some instances where the first recess 271 extends through the light-transmitting medium 94, the first recess 271 can extend into or through the buried layer 90. A second recess 272 extends into the bottom of the first recess 271 such that the substrate 92 includes pillars 273 extending upward from the bottom of the second recess 272. Electrical contacts 274 are positioned in the bottom of the second recess 272. A first conductor 275 on the light-transmitting medium 94 is in electrical communication with the electrical contacts 274. A second conductor 276 on the on the light-transmitting medium 94 is positioned adjacent to the first recess 271. The first conductor 275 and the second conductor 276 are each in electrical communication with a contact pad 277 on the light-transmitting medium 94. The contact pads 277 can be used to provide electrical communication between electronics and the light source 10.

A gain element 278 is positioned in the first recess 271 and on the pillars 273. The gain element 278 includes a gain medium 279. A gain waveguide 283 is defined in the gain medium 279. The gain element can be attached to the LIDAR chip using flip-chip technologies. Examples of suitable interfaces between gain elements and chips constructed from silicon-on-insulator wafer can be found in U.S. Pat. No. 9,705,278, issued on Jul. 11, 2017 and in U.S. Pat. No. 5,991,484 issued on Nov. 23, 1999; each of which is incorporated herein in its entirety.

A second conducting layer 280 is positioned on the gain medium 279. A third conductor 281 provides electrical communication between the second conducting layer 280 and the second conductor 276.

The gain element 278 includes three ridges that extend into the second recess 272. The central ridge defines a portion of the gain waveguide 283. The outer ridges are each in electrical communication with one of the electrical contacts 274 through a conducting medium 293 such as solder or conducting epoxy. Since the first conductor 275 is in electrical communication with the electrical contacts 274, the first conductor 275 is in electrical communication with the outer ridges.

The gain element 278 includes a reflecting structure 285 on the gain medium 279. In one example, the reflecting structure 285 is a highly reflecting structure such as a mirror. Suitable reflecting structures 285 include, but are not limited to, a layer of metal on the layer of gain medium 279, or one or more dielectric layers configured as a high-reflectivity (HR) coating.

The gain medium 279 includes sub-layers 290 between a lower gain medium 292 and an upper gain medium 294. The lower gain medium 292 and the upper gain medium 294 can be the same or different. Suitable lower gain media 292 include, but are not limited to, InP, doped InP, gallium nitride (GaN), InGaAsP, and GaAs. Suitable upper gain media 294 include, but are not limited to, InP, InGaAsP, and GaAs. Different sub-layers 290 can have different compositions. For instance, each sub-layer 290 can have a different dopant and/or dopant concentration from the one or more neighboring sub-layers 290 and/or each of the sub-layers 290 can have a different dopant and/or dopant concentration. As an example, each sub-layer 290 can include or consists of two or more components selected from a group consisting of In, P, Ga, and As and different sub-layers 290 can have the elements present in different ratios. In another example, each sub-layer 290 includes or consists In, P and none, one, or two components selected from a group consisting of Al, Ga, and As and each of the different sub-layers 290 has these components in a different ratio. Examples of materials that include multiple elements selected from the above group include different compositions of InP with or without dopants such as $In(x)P(1-x)$ or In—Ga—As—P. Additionally, there may be other sub-layers 290 present to compensate for stress due to lattice mismatch between the compositions of the different sub-layers 290. The location of the laser mode in the laser ridge is defined by the different sub-layers 290 as a result of the refractive indices of the different compositions.

The electrical communication between the second conducting layer 280 and the second conductor 276 provided by the third conductor 281 can be achieved using traditional techniques such as wire bonding.

The gain waveguide 283 is aligned with an input facet 287 of the utility waveguide 16 such that the utility waveguide 16 and the gain waveguide 283 can exchange light signals. Although not illustrated, the input facet 287 can optionally include one or more anti-reflective coatings such as silicon nitride. The space between the input facet 287 and the facet of the gain waveguide 283 can be filled with a transmitting medium that is a solid or a fluid. For instance, the space between the facet of the gain waveguide 283 and the input facet 287 can be filled with an epoxy, air, or gel. As a result, the light signals can travel directly between the gain element and the input facet 287 through the transmissive medium.

The input facet 287 for the utility waveguide 16 can be angled at less than ninety degrees relative to the direction of propagation in the utility waveguide 16. Angling the input facet 287 at less than ninety degrees can cause light signals reflected at the input facet 287 to be reflected out of the waveguide and can accordingly reduce issues associated with back reflection. Additionally or alternately, a facet of the gain waveguide 283 can be angled at less than ninety degrees relative to the direction of propagation in the gain waveguide 283.

The utility waveguide 16 includes an optical grating 300 configured to operate as a partial return device. For instance, the utility waveguide 16 can carry light signals to the optical grating 300. The optical grating 300 can be configured to transmit a first portion of the light signal and to return a second portion of the light signal to the same optical pathway from which the optical grating 300 received the light signal. In some instance, the return of the second portion of the light signal is a result of reflection. Suitable optical gratings include, but are not limited to, Bragg gratings, and sampled gratings.

During operation of the light source, the electronics can generate a light signal within the gain medium 279 by driving an electrical current through the gain medium 279. The electrical current can be generated by applying a potential difference between the first conductor 275 and the second conductor 276. The gain waveguide 283 carries the light from the gain medium 279 to the optical grating 300. The optical grating 300 returns a second portion of the laser signal to its original path. The optical grating 300 also transmits a first portion of the light signal such that the light signal continues on its path through the utility waveguide 16.

The second portion of the light signal returns to the gain waveguide 283. The gain waveguide 283 guides the second portion of the light signal through the gain medium 279 to the reflecting structure 285. The reflecting structure 285 reflects the second portion of the light signal such that the second portion of the light signal returns to the gain waveguide 283 and eventually to the optical grating 300. Accordingly, the second portion of the light signal travels through the gain waveguide 279 twice before returning to the optical grating 300. The gain medium 279 in combination with the multiple passes of the light signal through the gain medium 279 are a source of optical gain. Energy can be applied to the gain medium 279 to provide optical gain. Accordingly, the optical grating 300 and the reflecting structure 285 can form a resonant cavity in which the light signal resonates. As a result, the first portion of the light signal transmitted by the optical grating 300 can be a laser signal that serves as the outgoing LIDAR signal. In some instances, the energy provided to the light signal for pumping and/or providing gain to the light signal is electrical energy provided by the electronics but other forms of energy can be used to pump the light signal.

FIG. 9F is a topview of a portion of the utility waveguide 16 shown in FIG. 9A. FIG. 9F magnifies a section of FIG. 9A that includes the optical grating 300. FIG. 9G is a perspective view of a portion of the utility waveguide 16 and optical grating 300 shown in FIG. 9F. The utility waveguide 16 can carry the light signal directly from the input facet 287 to the optical grating 300. For instance, the utility waveguide 16 can exclude active components, inactive optical components, and waveguide branches between the input facet 287 and the optical grating 300.

The optical grating 300 includes perturbation structures 302 that are positioned in the utility waveguide 16 such that the perturbation structures 302ccc interact with light signals guided through the utility waveguide 16. The perturbation structures 302 each causes a perturbation in the effective index of refraction of the utility waveguide 16. For instance, each perturbation structure 302 can have an effective index of refraction that is different from the effective index of refraction that the utility waveguide 16 in the absence of the perturbation structures 302.

In FIG. 9A through FIG. 9H, the ridge 96 of the light-transmitting medium extends away from the slab regions 98 of the light-transmitting medium. The ridge 96 partially defines the utility waveguide 16. Recesses 310 extend into the top of the ridge 96. The recesses 310 are filled with a medium having a lower index of refraction than the light-transmitting medium 98. The medium can be a solid such as silica or a gas such as air. Accordingly, the recesses 310 provide perturbations in the effective index of refraction of the utility waveguide 16 and can each serve as a perturbation structure 302. In some instances, the recesses 310 are formed with photolithography that can be performed with a stepper combined with etching technologies such as wet etching.

The dimensions and shape of the perturbation structures 302 can be the same or substantially the same. For instance, the recesses 310 can have one or more surfaces with a first width labeled $W_T$ in FIG. 9G, one or more surfaces with a second width labeled $W_L$ in FIG. 9G, and a depth labeled $d_r$. In some instances, the first width ($W_T$) represents the width of a perturbation structure 302 in a direction that is perpendicular to a longitudinal axis of the utility waveguide 16 (the transverse direction) and can be considered the transverse direction width. Additionally or alternatively, the second width ($W_L$) represents the width of a perturbation structure 302 in a direction that is parallel to the longitudinal axis of the utility waveguide 16 and can be considered the longitudinal direction width. In some instances, the dimensions and shape of all or a portion of the recesses 310 can be the same or substantially the same. For instance, the recesses 310 can each have the same or about the same second width ($W_L$) and the same depth ($d_r$). Alternately, the recesses 310 can have the same or about the same second width ($W_L$), the same first width ($W_T$) and the same depth ($d_r$).

The utility waveguide 16 has a longitudinal axis and the portion of the utility waveguide 16 extending through the optical grating serves as a grating axis. The line labeled $L_p$ in FIG. 9F can represent a projection of the longitudinal axis in a direction that is perpendicular to the substrate (labeled 92 in FIG. 9G and FIG. 9H) and/or the base onto an upper surface of the utility waveguide 16. The portion of the longitudinal axis projection between the brackets labeled $G_a$ represents the projection of the grating axis onto the upper surface of the utility waveguide 16. The optical grating has the perturbation structures 302 arranged in multiple different sub-gratings. For instance, the perturbation structures 302 that are shown below the grating axis projection in FIG. 9F are included in a first sub-grating and the perturbation structures 302 that are shown above the grating axis projection in FIG. 9F are included in a second sub-grating.

The perturbation structures 302 in the same sub-grating have the same orientation relative to the grating axis but the perturbation structures 302 in different sub-gratings have different orientations relative to the grating axis. For instance, FIG. 9H is a cross section of the utility waveguide 16 taken through a recess 310 that serves as a perturbation structure 302 included in the second sub-grating. As an example, the cross section of FIG. 9H can be a cross section taken along the line labeled H in FIG. 9F and/or FIG. 9G. The dashed line in FIG. 9G represents a recess 310 that serves as a perturbation structure 302 included in the first sub-grating and is accordingly positioned in the background of the cross section.

Each of the perturbation structures 302 is associated with an orientation line that can be drawn the shortest possible distance between the grating axis and the perturbation structure 302. For instance, in FIG. 9H, a line labeled V represents an orientation line that extends the shortest possible distance between the grating axis labeled L and the recess 310 that serves as a perturbation structure 302 included in the second sub-grating. The direction and/or length of the orientation line labeled V can be the same or substantially the same for each recess 310 that serves as a perturbation structure 302 included in the second sub-grating. A line labeled V' extends the shortest possible distance between the grating axis and the recess 310 that serves as a perturbation structure 302 included in the first sub-grating. The direction and/or length of the orientation line labeled V' can be the same or substantially the same for each recess 310 that serves as a perturbation structure 302 included in the first sub-grating. However, the direction of the orientation line labeled V' is different from the direction of the orientation lines labeled V. As a result, the perturbation structures 302 included in the second sub-grating have a different orientation relative to the grating axis than the perturbation structures 302 included in the first sub-grating.

In some instances, each of the perturbation structures 302 has one or more corresponding features that are common to each of perturbation structures. In these instances, the perturbation structures 302 are each associated with a different common axis that is parallel to the grating axis. For instance, the perturbation structures 302 in each sub-grating can be positioned such that the associated common axis can extend through the same corresponding feature of each perturbation structure 302 included in the same sub-grating. However, the common axes associated with different sub-grating are spaced apart from one another even when the common axes extend through the same corresponding feature in the perturbation structures 302 from different sub-gratings.

As an example of common axes, FIG. 9F shows two common axes that each extends through the same corresponding feature of the perturbation structures 302 in different sub-gratings. For instance, each of the common axes extends through a corresponding surface for the perturbation structures 302 in different sub-gratings. The corresponding surface is the surface of the perturbation structures 302 that is closest to the upper lateral side of the ridge 96 defining the utility waveguide 16. For instance, FIG. 9F shows a first common axis labeled CA1 extending through a corresponding surface of each perturbation structure 302 included in the first sub-grating. Additionally, a second common axis labeled CA2 extends through the same corresponding surface in each perturbation structure 302 included in the second sub-grating. The first common axis is spaced apart from the second common axis despite the first common axis and the second common axis intersecting the same corresponding feature perturbation structures 302 included in different sub-gratings. For instance, the first common axis and the second common axis each extends through the perturbation structure surfaces that are closest to the side of the ridge 96 labeled CR. Suitable corresponding features include, but are not limited to, the centroid of each perturbation structure 302, a corresponding point on each perturbation structure 302, a corresponding surface on each perturbation structure 302. In some instances, each of the common axes do not extend through perturbation structures 302 that are members of a sub-grating other than the sub-grating with which the common axis is associated as is evident in FIG. 9F.

The arrangement of the perturbation structures 302 can be described relative to a Cartesian coordinate system illustrated in FIG. 9F. The coordinate system has a longitudinal direction with an axis that is parallel to the longitudinal axis (labeled LA) and a transverse direction with a transverse axis (labeled TA). The transverse direction is transverse to the longitudinal direction. In some instances, the transverse axis is parallel to a substrate and/or to a surface of the substrate such as the substrate 92 shown in FIG. 9E and FIG. 9G. The perturbation structures 302 in the same sub-grating overlap one another in the transverse direction, but the perturbation structures 302 in different sub-gratings do not overlap one another in the transverse direction and are instead spaced apart in the transverse direction.

In some instances, the perturbation structures 302 that are members of the same sub-grating have the same dimensions and shape. For instance, the recesses 310 in each sub-grating can each have the same or about the same longitudinal direction width ($W_L$) and the same depth ($d_r$). Alternately, the recesses 310 in each sub-grating can each have the same or about the same longitudinal direction width ($W_L$), the same transverse direction width ($W_T$) and the same depth ($d_r$).

In some instances, the perturbation structures 302 that are members of the same sub-grating have the same dimensions and shape and perturbation structures 302 that are members different sub-gratings have the same dimensions and/or shapes. For instance, the perturbation structures 302 that are members of the same sub-grating and the perturbation structures 302 that are members of different sub-gratings have the same longitudinal direction width ($W_L$), the same transverse direction width ($W_T$) and the same depth ($d_r$). In some instances, the perturbation structures 302 that are members of the same sub-grating have the same dimensions and shape but perturbation structures 302 that are members different sub-gratings have different dimensions and/or shapes. For instance, the perturbation structures 302 that are members of the same sub-grating can have the same longitudinal direction width ($W_L$), the same transverse direction width ($W_T$) and the same depth ($d_r$) but the perturbation structures 302 that are members different sub-gratings can have the same longitudinal direction widths ($W_L$), and the same depths ($d_r$) but different transverse direction widths ($W_T$).

The perturbation structures 302 in each sub-grating can be periodically spaced apart in the longitudinal direction. The sub-grating periods are labeled $P_i$ in FIG. 9F where i is an integer and each value of i is associated with a different one of the sub-gratings. In some instances, the value of all or a portion of the sub-grating periods ($P_i$) is the same for each sub-grating.

The perturbation structures 302 from different sub-gratings are spaced apart in the longitudinal direction. For instance, in the longitudinal direction, the perturbation structures 302 from one sub-grating can alternate with perturbation structures 302 from another sub-grating. As an example, the perturbation structures 302 can be arranged such that in the longitudinal direction, each of the one or more perturbation structures 302 that is/are adjacent to each perturbation structure 302 are a member of a sub-grating other than the sub-grating to which the perturbation structure 302 belongs. When the perturbation structures 302 from the different sub-gratings are considered in combination, the perturbation structures 302 are periodically spaced in the longitudinal direction. For instance, the periodic spacing between the perturbation structures 302 from different sub-gratings in the longitudinal direction (the composite grating period) is labeled $P_c$ in FIG. 9F. The pattern of the perturbation structures 302 within a composite grating period ($P_c$) is repeated multiple times within a grating length (Lth). A prior art optical grating, such as a conventional Bragg grating that excludes multiple sub-gratings, with a period (or pitch) that has the same value as the composite grating period ($P_c$) generates a laser signal with the same or about the same wavelength as the disclosed optical grating.

In some instances, the perturbation structures 302 are arranged such that sub-grating periods ($P_i$) is the same for each sub-grating and the composite grating period ($P_a$) is equal to the sub-grating periods ($P_i$)/N where N is an integer greater than or equal to 2. In some instances, N represents the number of sub-gratings in the optical grating.

The perturbation structures 302 from different sub-gratings are also spaced apart in the transverse direction. For instance, in the transverse direction, the perturbation structures 302 from one sub-grating can be separated from the perturbation structures 302 from another sub-grating by a gap labeled G in FIG. 9F. As a result, the perturbation structures 302 from different sub-gratings are spaced apart in the transverse direction such that there is no axis parallel to the grating axis through the perturbation structures 302 from different sub-gratings. As will be described in more detail below, increasing the value of G increases the shortest distance between the perturbation structures 302 and accordingly reduces the level of resolution that is required to successfully etch the perturbation structures 302.

Since the perturbation structures 302 from different sub-gratings are spaced apart in the transverse direction and in the longitudinal direction, the shortest possible distance between a perturbation structure 302 and each of the adjacent perturbation structure 302 is illustrated by a line that is diagonal to the grating axis. An example of the diagonal lines associated with a single perturbation structure 302 are labeled $D_1$ and $D_2$ in FIG. 9F. The diagonal lines are diagonal relative to the longitudinal direction and the transverse direction in that the diagonal lines are neither parallel nor perpendicular to the grating axis.

In some instances, the perturbation structures 302 are arranged such that the diagonal lines extending between the perturbation structures 302 in different sub-grating have the same length or about the same length. The diagonal line each have a length that is longer than the length of the spacing between the perturbation structures 302 in the longitudinal direction (labeled S in FIG. 9F). The length of the spacing is equal to the composite grating period minus the width of the perturbation structure 302 in the longitudinal direction ($P_c$-$W_L$). As a result, the diagonal vectors have a length that is longer than the composite grating period minus the width of the perturbation structure 302 in the longitudinal direction ($P_c$-$W_L$).

As noted above, in some instances, the perturbation structures 302 are formed by photolithography and etching. Etched features such as perturbation structures 302 can merge into each other as the distance between the etched features falls below a resolution limit of the photolithography process. In prior art prior art optical gratings; the shortest distance between the perturbation structures 302 is equal to the grating period or pitch (P) minus the longitudinal direction width of the perturbation structure 302 (P-$W_L$). The disclosed optical grating and a prior art optical grating output the same wavelength or about the same wavelength when the composite grating period $P_c$ and the width of the perturbation structure 302 in the longitudinal direction ($W_L$) of the disclosed grating are the same as the grating period or pitch (P) and the width of the perturbation structure 302 in the longitudinal direction ($W_L$) of the prior art grating. However, the shortest distance between the etch features in the disclosed grating is larger than the shortest distance between the etch features in the prior art grating because the diagonal lines each have a length that is longer than the length of the spacing between the perturbation structures 302 in the prior art optical gratings. Increasing in the separation between the etched features (the perturbation structures 302) can bring the grating within the resolution capabilities of conventional photolithography processes and can accordingly permit the use of affordable photolithography technologies in fabrication of the optical grating.

As is evident from FIG. 9F, the separation distances ($D_1$, $D_2$) between the perturbation structures 302 can be increased by increasing the separation of the perturbation structures 302 in the transverse direction shown by the gap labeled G in FIG. 9F and/or the spacing between the perturbation structures 302 in the longitudinal direction labeled S in FIG. 9F. However, the wavelength of the laser signal output from the optical grating can be a function of the longitudinal direction spacing between the perturbation structures 302 (S). As a result, changes to the longitudinal direction spacing between the perturbation structures 302 (S) can be limited by the desire to output a laser signal with a particular wavelength. Accordingly, the separation of the perturbation structures 302 in the transverse direction (G) can be selected to achieve the desired level separation between the perturbation structures 302. In some instances, the perturbation structures 302 are arranged such that the shortest diagonal line is greater than or equal to 60, 70, or 80 nm and/or less than or equal to 90, 100, or 110 nm.

All or a portion of the grating features described above can be varied to provide a grating that outputs a laser signal with the desired wavelength while keeping a separation between perturbation structures 302 that is sufficient to permit the desired technology to be used to form the perturbation structures 302. For instance, the optical grating can be constructed as a first order grating that outputs a laser signal with a wavelength greater than 850 nm and less than or equal to 1270, 1310, or 1350 nm. The composite grating period ($P_a$) for a first order grating can be configured to have a composite grating period ($P_c$) that equals or substantially equals one half of the desired wavelength. In some instances, the perturbation structures 302 are arranged to provide a composite grating period ($P_a$) greater than or equal to 180, 182 and/or less than or equal to than 192, or 194 nm.

In some instances, the optical grating is constructed to output a laser signal with a wavelength greater than or equal to 1000, 1300, or 1340 nm and less than or equal to 1350, 1400, or 1450 nm and with all, a portion, 3, 4 or 5 of the features selected from a group consisting of: one or more of the sub-gratings having a sub-grating period ($P_i$) greater than or equal to 360, 372, or 384 nm and less than or equal to 386, 400, or 414 nm; a composite grating period ($P_a$) greater than or equal to 180, 186, or 192 nm and less than or equal to 193, 200, or 207 nm; separation of perturbation structures 302 in the transverse direction by a gap (G) that is greater than or equal to 50, 60, or 70 nm and less than or equal to than 80, 90, or 100 nm; perturbation structures 302 arranged such that a diagonal distance between each pair of perturbation structures 302 that is adjacent to each other in the longitudinal direction and includes perturbation structure 302 from different sub-gratings is greater than or equal to 110, 115, or 120 nm and less than or equal to than 130, 135, or 140 nm; perturbation structures 302 having a longitudinal direction width ($W_L$) that is greater than or equal to 80, 90, or 100 nm and less than or equal to than 110, 120, or 130 nm; a grating length (Lth) greater than or equal to 100, 200, or 300 um and less than or equal to than 1000, 5000, or 10,000 um, the pattern of the perturbation structures 302 within the composite grating period ($P_c$) is repeated within the grating length (Lth) a number of times greater than or equal to 500, 1000, or 1500 and less than or equal to than 5000, 25000, or 50000; a longitudinal direction spacing between perturbation structures 302 (S) greater than or equal to 80, 90, or 100 nm and less than or equal to than 110, 120, or 130 nm.

Figure 10:
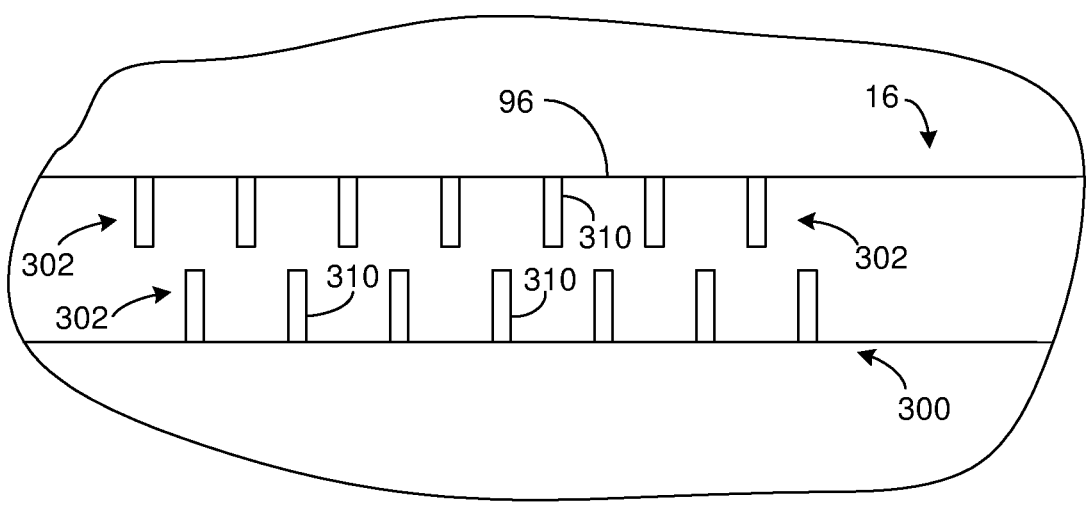
FIG. 10 is a topview of an optical grating having recesses that extend to the lateral sides of a utility waveguide.

In FIG. 9F, the perturbation structures 302 are shown spaced apart from a lateral side of the ridge 96 by a lateral gap labeled $TS_1$ or $TS_2$. The lateral gap labeled $TS_1$ can be the same or different from the lateral gap labeled $TS_2$. In some instances, one or both lateral gaps ($TS_1$ and $TS_2$) is greater than or equal to 100, 110, or 120 nm and/or less than or equal to than 200, 210, or 220 nm. The laterals gap are optional and the perturbation structures 302 can extend to the lateral side of the ridge as illustrated in FIG. 10. Additionally or alternately to the recesses 310 extending into the top of the ridge, the recesses 310 can extend into the lateral side of the ridge and/or into the slab regions 98 next to the ridge 96.

Figure 11:
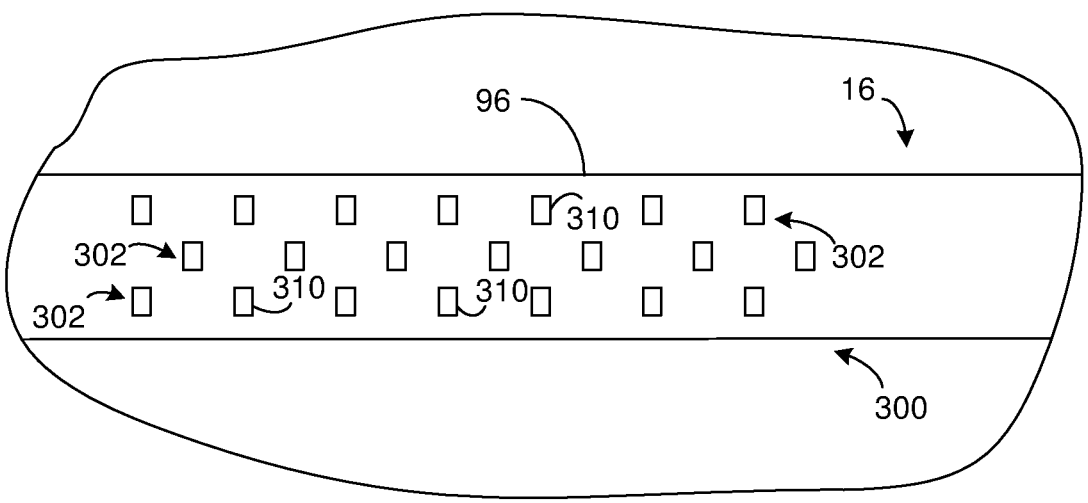
FIG. 11 is a topview of an optical grating having perturbation structures arranged in more than two sub-gratings.

Although FIG. 9A through FIG. 9H illustrate the optical grating as having two sub-gratings, the optical grating can include more than two sub-gratings. For instance, FIG. 11 is a topview of an optical grating that includes three sub-gratings. Two of the sub-gratings include perturbation structures 302 that are positioned at the same locations in the longitudinal direction but are spaced apart in the transverse direction.

Figure 12:
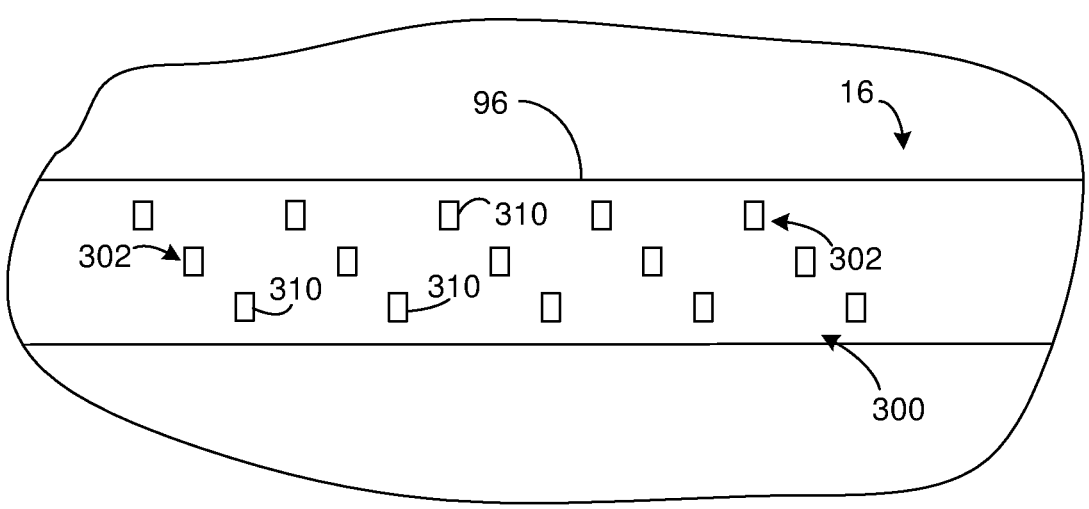
FIG. 12 is a topview of another embodiment of an optical grating having perturbation structures arranged in more than two sub-gratings.

When an optical grating includes more than two sub-gratings, perturbation structures 302 from different sub-gratings need not be positioned at the same locations in the longitudinal direction. For instance, FIG. 12 is a topview of an optical grating that includes three sub-gratings. None of the perturbation structures 302 that are positioned at the same locations in the longitudinal direction.

Although the transverse direction widths ($W_T$) of the perturbation structures 302 are shown as being the same, the transverse direction widths ($W_T$) of the perturbation structures 302 in different sub-gratings can be different. For instance, the perturbation structures 302 in the outermost sub-gratings in FIG. 11 and FIG. 12 can have transverse direction widths ($W_T$) that are narrower than the transverse direction widths ($W_T$) of the perturbation structures 302 in the center sub-grating.

EXAMPLE 1

A prior art first order Bragg grating without sub-gratings can be constructed with recesses in a ridge waveguide serving as perturbation structures. The perturbation structures can have a pitch of 185 nm, a longitudinal direction perturbation structure width ($W_L$) of 110 nm, and a transverse direction perturbation structure width ($W_T$) of 2200 nm. The Bragg grating outputs a laser signal with a wavelength of about 1295 nm. The shortest distance between perturbation structures was 75 nm.

An optical grating can be constructed according to FIG. 9F through FIG. 9H. The first sub-grating and the second sub-grating can each have a sub-grating period ($P_i$) of 370 nm arranged to provide a composite grating period ($P_c$) of 185 nm. The perturbation structures can have a longitudinal direction perturbation structure width ($W_L$) of 110 nm, and a transverse direction perturbation structure width ($W_T$) of 1055 nm. The perturbation structures in the first sub-grating can be separated from the perturbation structures in the second sub-grating in the transverse direction (G) by a gap of 90 nm. Similar to the prior art Bragg grating, the optical grating outputs a laser signal with a wavelength of about 1295 nm; however, the shortest distance between perturbation structures was on a diagonal line with a length of about 117 nm.

Although the light source is disclosed as having recesses used as perturbation structures, other perturbation structures are possible. Examples of other suitable perturbation structures include, but are not limited to, overlayers increasing the thickness of the waveguide, overlayers modifying the effective index of the waveguide through stress, or in diffused or implanted ion species.

Although the light source is disclosed in the context of a LIDAR system, the light source can be used in other applications such as sensing, imaging and telecommunications. Although the light source is disclosed as an external cavity laser, the optical grating can be included in other laser cavity configurations such as distributed feedback lasers, distributed bragg reflector lasers, and discrete mode lasers.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A LIDAR system, comprising:
   a resonant laser cavity that includes an optical grating and a waveguide having a longitudinal axis, a portion of the longitudinal axis that extends through the optical grating serving as a grating axis,
   the laser cavity being configured to generate a laser signal that exits the laser cavity through the optical grating,
   the optical grating including multiple perturbation structures that each causes a perturbation in an effective refractive index of the waveguide, and
   the perturbation structures being staggered on the waveguide such that perturbation structures that are adjacent to one another in a longitudinal direction are spaced apart in a transverse direction, the longitudinal direction being parallel to the grating axis and the transverse direction being transverse to the longitudinal direction.

2. The system of claim 1, wherein the perturbation structures are arranged in sub-gratings such that perturbation structures in the same sub-grating overlap one another in the transverse direction and the perturbation structures from different sub-gratings are spaced apart in the transverse direction.

3. The system of claim 2, wherein the perturbation structures are arranged in sub-gratings such that perturbation structures that are adjacent to one another in the longitudinal direction are members of different sub-gratings.

4. The system of claim 3, wherein the perturbation structures from different sub-gratings are spaced apart in the transverse direction by a gap of more than 90 nm.

5. The system of claim 4, wherein the optical grating outputs a laser signal with a wavelength less than 1450 nm.

6. The system of claim 5, wherein the optical grating is a first order grating.

7. The system of claim 6, wherein the perturbation structures that are members of the same sub-grating are arranged periodically in the longitudinal direction.

8. The system of claim 7, wherein the perturbation structures from the different sub-gratings combine such that the perturbation structures from different sub-gratings are periodically spaced in the longitudinal direction at a composite period ($P_c$).

9. The system of claim 8, wherein the periodic arrangement of the perturbation structures in each sub-grating is spaced at a sub-grating period, and the perturbation structures are arranged such that the composite period is 1/N times the sub-grating period where N is the number of sub-grating included in the optical grating.

10. The system of claim 3, wherein the perturbation structures each has a transverse direction width measured in the transverse direction and the transverse direction width of the perturbation structures in the same sub-grating is the same.

11. The system of claim 1, wherein the perturbation structures are arranged in sub-gratings such that no line that is parallel to the grating axis extends through the perturbation structures in more than one sub-grating.

12. The system of claim 11, wherein the perturbation structures are arranged such that a line that is parallel to the grating axis can extend through each perturbation structure in the same sub-grating.

13. The system of claim 1, wherein the perturbation structures are arranged such that the shortest possible line that can be drawn between perturbation structures that are adjacent to each other in the longitudinal direction is diagonal relative to the grating axis.

14. The system of claim 13, wherein the perturbation structures are arranged such a length of each line is less than 110 nm.

15. The system of claim 14, wherein the optical grating outputs a laser signal with a wavelength less than 1450 nm.

16. The system of claim 1, wherein the waveguide is a ridge waveguide and the perturbation structures each include a recess in a ridge of the ridge waveguide.

17. The system of claim 1, wherein the light source is included in a Photonic Integrated Circuit (PIC) on a LIDAR chip.

18. The system of claim 1, wherein the LIDAR chip is constructed on a silicon-on-insulator platform.

19. A LIDAR system, comprising:
a resonant laser cavity that includes a waveguide and an optical grating,
the laser cavity is configured to generate a laser signal that exits the laser cavity through the optical grating,
the optical grating including multiple perturbation structures that each causes a perturbation in an effective refractive index of the waveguide,
the perturbation structures being arranged in sub-gratings such that each sub-grating includes more than one of the perturbation structures, and
perturbation structures in the same subgroup have the same orientation relative to a longitudinal axis of the waveguide but the perturbation structures in different subgroup have different orientations relative to the longitudinal axis of the waveguide.

20. The LIDAR system of claim 1, wherein each of the perturbation structures has a corresponding feature that corresponds to the common location on each of the other perturbation structures,
a first axis that is parallel to the longitudinal axis of the waveguide can extend through the corresponding locations on each perturbation structure included in a first one of the sub-gratings,
a second axis that is parallel to the longitudinal axis of the waveguide can extend through the corresponding locations on each perturbation structure included in a second one of the sub-gratings, and
the first axis is spaced apart from the second axis.

* * * * *